(12) United States Patent
Shin et al.

(10) Patent No.: US 12,156,401 B2
(45) Date of Patent: Nov. 26, 2024

(54) THREE-DIMENSIONAL SEMICONDUCTOR MEMORY DEVICE AND A METHOD OF MANUFACTURING THE SAME

(71) Applicant: SAMSUNG ELECTRONICS CO., LTD., Suwon-si (KR)

(72) Inventors: Joongchan Shin, Seoul (KR); Byeungmoo Kang, Hwaseong-si (KR); Sangyeon Han, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 450 days.

(21) Appl. No.: 17/477,634

(22) Filed: Sep. 17, 2021

(65) Prior Publication Data

US 2022/0093626 A1 Mar. 24, 2022

(30) Foreign Application Priority Data

Sep. 18, 2020 (KR) .................. 10-2020-0120674

(51) Int. Cl.
*H10B 41/27* (2023.01)
*G11C 5/06* (2006.01)
*H01L 23/538* (2006.01)
*H10B 43/27* (2023.01)

(52) U.S. Cl.
CPC .............. *H10B 41/27* (2023.02); *G11C 5/06* (2013.01); *H01L 23/5386* (2013.01); *H10B 43/27* (2023.02)

(58) Field of Classification Search
CPC ...... H10B 41/27; H10B 43/27; H10B 12/482; H10B 12/05; H10B 12/30; H10B 12/03; H10B 41/35; H10B 43/35; G11C 5/06; H01L 23/5386
See application file for complete search history.

(56) References Cited

U.S. PATENT DOCUMENTS

| | | |
|---|---|---|
| 9,356,041 B2 | 5/2016 | Han |
| 10,304,749 B2 | 5/2019 | Petz et al. |
| 10,332,835 B2 | 6/2019 | Lai et al. |
| 10,784,272 B2 | 9/2020 | Lee et al. |
| 10,854,612 B2 | 12/2020 | Cho et al. |

(Continued)

FOREIGN PATENT DOCUMENTS

| | | |
|---|---|---|
| CN | 110310993 | 10/2019 |
| CN | 110797322 | 2/2020 |

(Continued)

*Primary Examiner* — S M Sohel Imtiaz
(74) *Attorney, Agent, or Firm* — F. CHAU & ASSOCIATES, LLC

(57) ABSTRACT

A three-dimensional (3D) semiconductor memory device including: stack structures spaced apart from each other on a semiconductor substrate, wherein each of the stack structures includes interlayer insulating layers and semiconductor patterns alternately stacked on the semiconductor substrate; conductive patterns provided between the interlayer insulating layers vertically adjacent to each other and connected to the semiconductor patterns; and a protective structure covering a top surface of the semiconductor substrate between the stack structures, wherein a top surface of the protective structure is located between a top surface and a bottom surface of a lowermost interlayer insulating layer of the interlayer insulating layers.

20 Claims, 41 Drawing Sheets

(56) References Cited

U.S. PATENT DOCUMENTS

| | | | |
|---|---|---|---|
| 11,101,283 B2 | 8/2021 | Kim et al. | |
| 2002/0084477 A1* | 7/2002 | Uchiyama | H10B 41/40 257/296 |
| 2008/0261379 A1 | 10/2008 | Jinbo et al. | |
| 2012/0043673 A1* | 2/2012 | Chang | H10B 41/27 257/E23.141 |
| 2014/0021485 A1* | 1/2014 | Cho | H10B 12/05 257/77 |
| 2014/0284695 A1* | 9/2014 | Won | H01L 29/42344 257/324 |
| 2015/0055414 A1* | 2/2015 | Chen | G11C 5/063 438/618 |
| 2017/0084618 A1* | 3/2017 | Peri | H10B 43/35 |
| 2017/0092371 A1* | 3/2017 | Harari | H01L 29/66833 |
| 2018/0308856 A1* | 10/2018 | Cho | H10B 43/27 |
| 2019/0164985 A1* | 5/2019 | Lee | H01L 23/53295 |
| 2021/0265381 A1* | 8/2021 | Lee | H10B 43/27 |

FOREIGN PATENT DOCUMENTS

| | | |
|---|---|---|
| KR | 10-0948477 | 3/2010 |
| KR | 10-1447048 | 10/2014 |
| KR | 10-2019-0060251 | 6/2019 |

* cited by examiner

THREE-DIMENSIONAL SEMICONDUCTOR MEMORY DEVICE AND A METHOD OF MANUFACTURING THE SAME

CROSS-REFERENCE TO RELATED APPLICATION

This U.S. non-provisional patent application claims priority under 35 U.S.C. § 119 to Korean Patent Application No. 10-2020-0120674, filed on Sep. 18, 2020, in the Korean Intellectual Property Office, the disclosure of which is incorporated by reference herein in its entirety.

TECHNICAL FIELD

Embodiments of the inventive concept relate to a three-dimensional (3D) semiconductor memory device and a method of manufacturing the same and, more particularly, to a 3D semiconductor memory device with increased reliability and integration density and a method of manufacturing the same.

DISCUSSION OF RELATED ART

Semiconductor devices, such as semiconductor memory, have been highly integrated to provide increased performance and low manufacturing costs. The integration density of semiconductor devices can reduce the costs of the semiconductor devices, thereby resulting in a demand for highly integrated semiconductor devices. The integration density of two-dimensional (2D) or planar semiconductor devices may be determined by an area occupied by a unit memory cell. Therefore, the integration density of the 2D or planar semiconductor devices may be greatly affected by a technique of forming fine patterns. However, since extremely high-priced apparatuses are needed to form fine patterns, the integration density of 2D semiconductor devices continues to increase but is still limited. Thus, three-dimensional (3D) semiconductor memory devices, which include three-dimensionally arranged memory cells, have been developed.

SUMMARY

An embodiment of the inventive concept provides a three-dimensional (3D) semiconductor memory device including: stack structures spaced apart from each other on a semiconductor substrate, wherein each of the stack structures includes interlayer insulating layers and semiconductor patterns alternately stacked on the semiconductor substrate; conductive patterns provided between the interlayer insulating layers vertically adjacent to each other and connected to the semiconductor patterns; and a protective structure covering a top surface of the semiconductor substrate between the stack structures, wherein a top surface of the protective structure is located between a top surface and a bottom surface of a lowermost interlayer insulating layer of the interlayer insulating layers.

An embodiment of the inventive concept provides a 3D semiconductor memory device including: a semiconductor substrate including first and second recess regions which extend in a first direction and are spaced apart from each other in a second direction different from the first direction; a stack structure disposed between the first and second recess regions in a plan view and including interlayer insulating layers and semiconductor patterns which are alternately stacked on the semiconductor substrate; a first conductive pattern extending in a third direction perpendicular to a top surface of the semiconductor substrate and intersecting the stack structure; second conductive patterns provided between the interlayer insulating layers vertically adjacent to each other, the second conductive patterns crossing first end portions of the semiconductor patterns in the first direction; data storage elements provided between the interlayer insulating layers vertically adjacent to each other and connected to second end portions, opposite to the first end portions, of the semiconductor patterns; a first protective structure disposed in the first recess region; and a second protective structure disposed in the second recess region.

An embodiment of the inventive concept provides a 3D semiconductor memory device including: a semiconductor substrate including first and second recess regions which extend in a first direction and are spaced apart from each other in a second direction different from the first direction; stack structures disposed between the first and second recess regions in a plan view and spaced apart from each other in the first direction, wherein each of the stack structures includes interlayer insulating layers and semiconductor patterns which are alternately stacked on the semiconductor substrate; word lines extending in a third direction perpendicular to a top surface of the semiconductor substrate and intersecting the stack structures, respectively; bit lines provided between the interlayer insulating layers vertically adjacent to each other and in contact with first end portions of the semiconductor patterns, wherein the bit lines extend in the first direction; storage electrodes provided between the interlayer insulating layers vertically adjacent to each other and in contact with second end portions, opposite to the first end portions, of the semiconductor patterns; a first protective structure disposed in the first recess region; a filling insulation pattern covering sidewalls of the bit lines and sidewalls of the interlayer insulating layers and disposed on the first protective structure; a second protective structure disposed in the second recess region; a plate electrode covering the storage electrodes and disposed on the second protective structure; and a dielectric layer between the plate electrode and the storage electrodes, wherein each of the first and second protective structures includes: a first protective pattern covering a sidewall of a lowermost interlayer insulating layer of the interlayer insulating layers; and a second protective pattern, wherein the second protective pattern of the first protective structure is disposed between the first protective pattern of the first protective structure and a sidewall of the first recess region and covers a bottom surface of the first recess region, and the second protective pattern of the second protective structure is disposed between the first protective pattern of the second protective structure and a sidewall of the second recess region and covers a bottom surface of the second recess region, wherein topmost surfaces of the first and second protective structures are located between a top surface and a bottom surface of the lowermost interlayer insulating layer.

An embodiment of the inventive concept provides a method of manufacturing a 3D semiconductor memory device, the method including: forming a preliminary stack structure by alternately stacking sacrificial layers and semiconductor layers on a semiconductor substrate; forming an opening exposing a top surface of the semiconductor substrate by patterning the preliminary stack structure, wherein the forming of the opening includes forming a recess region by recessing the top surface of the semiconductor substrate exposed by the opening; replacing the sacrificial layers exposed by the opening with interlayer insulating layers; forming a protective pattern covering a surface of the recess region; forming horizontal recess regions between the interlayer insulating layers by etching portions of the semiconductor layers exposed by the opening; and forming conductive patterns in the horizontal recess regions, wherein the forming of the horizontal recess regions include performing an isotropic etching process having an etch selectivity with respect to the interlayer insulating layers and the protective pattern.

BRIEF DESCRIPTION OF THE DRAWINGS

The inventive concept will become more apparent by describing in detail embodiments thereof with reference to the attached drawings and accompanying detailed description.

DETAILED DESCRIPTION OF THE EMBODIMENTS

Figure 1A:
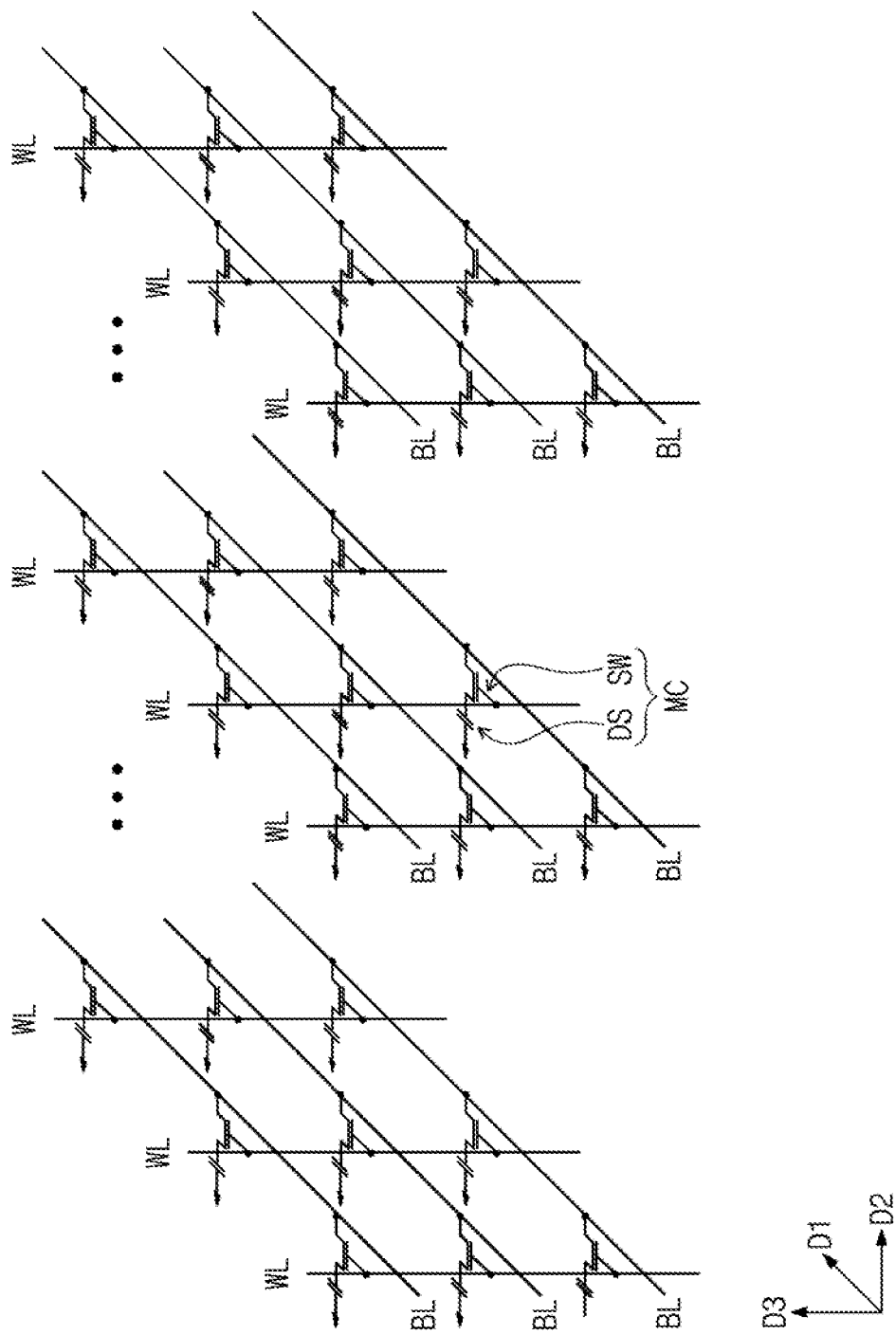
FIGS. 1A and 1B are schematic circuit diagrams illustrating cell arrays of three-dimensional (3D) semiconductor memory devices according to embodiments of the inventive concept.

Hereinafter, embodiments of the inventive concept will be described more fully with reference to the accompanying drawings. Like reference numerals may refer to like elements throughout the specification.

Figure 1B:
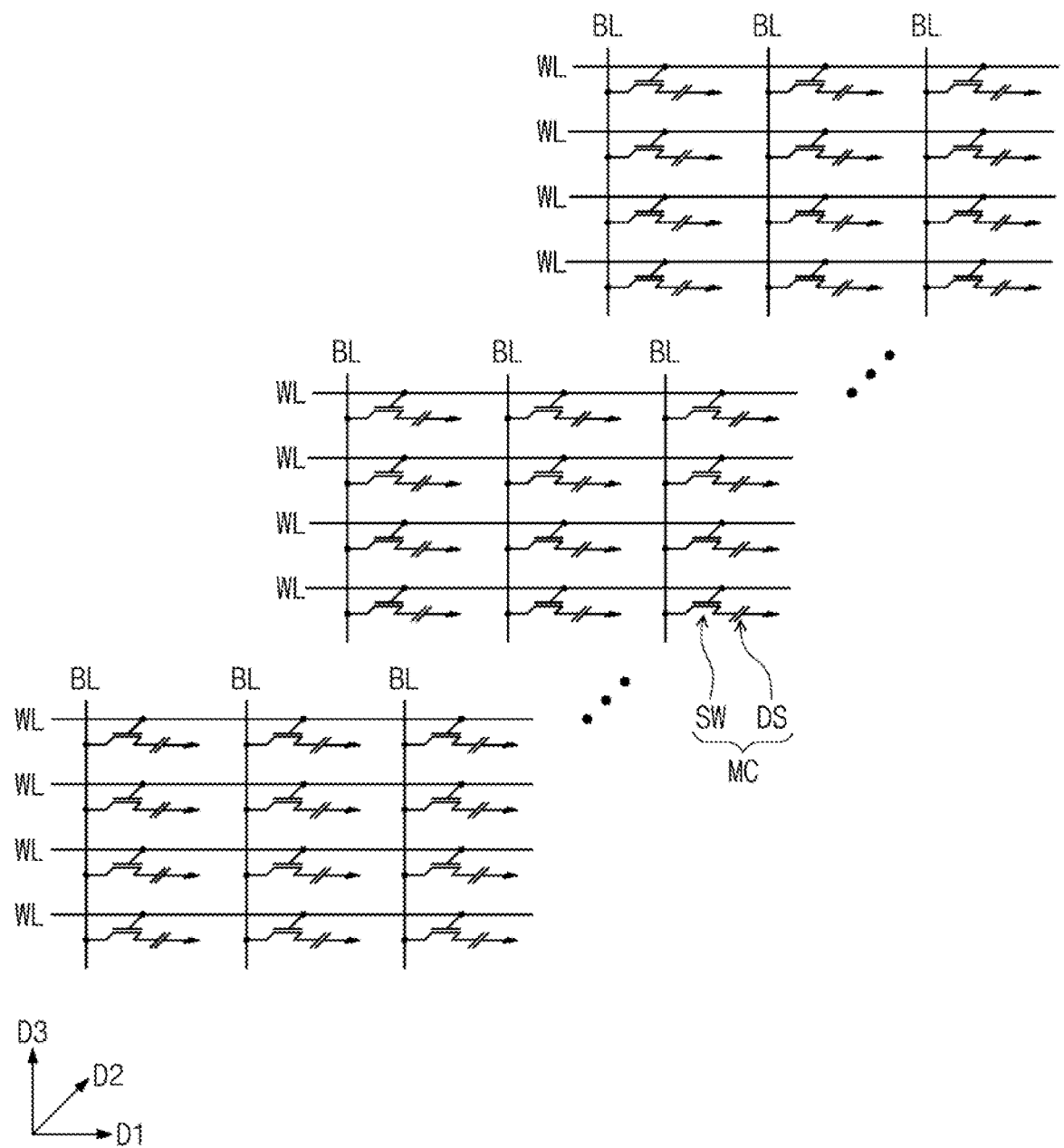

FIGS. 1A and 1B are schematic circuit diagrams illustrating cell arrays of three-dimensional (3D) semiconductor memory devices according to embodiments of the inventive concept.

Referring to FIGS. 1A and 1B, a memory cell array may include a plurality of memory cells MC three-dimensionally arranged. Each of the memory cells MC may be connected between a word line WL and a bit line BL which intersect each other.

Referring to FIG. 1A, bit lines BL may extend in parallel in a first direction D1 and may be spaced apart from each other in a second direction D2 intersecting the first direction D1 and in a third direction D3 intersecting the first and second directions D1 and D2. Word lines WL may extend in parallel in the third direction D3 and may be spaced apart from each other in the first direction D1 and the second direction D2.

Referring to FIG. 1B, word lines WL may extend in parallel in the first direction D1 and may be spaced apart from each other in the second direction D2 and the third direction D3. Bit lines BL may extend in parallel in the third direction D3 and may be spaced apart from each other in the first direction D1 and the second direction D2.

Referring to FIGS. 1A and 1B, each of the memory cells MC may include a selection element SW and a data storage element DS, and the selection element SW and the data storage element DS may be electrically connected in series to each other. The data storage element DS may be connected between the bit line BL and the selection element SW, and the selection element SW may be connected between the data storage element DS and the word line WL. The selection element SW may be a field effect transistor (FET), and the data storage element DS may be a capacitor, a magnetic tunnel junction (MTJ) pattern, or a variable resistor. For example, the selection element SW may include a transistor, a gate electrode of the transistor may be connected to the word line WL, and drain/source terminals of the transistor may be connected to the bit line BL and the data storage element DS, respectively.

Figure 2:
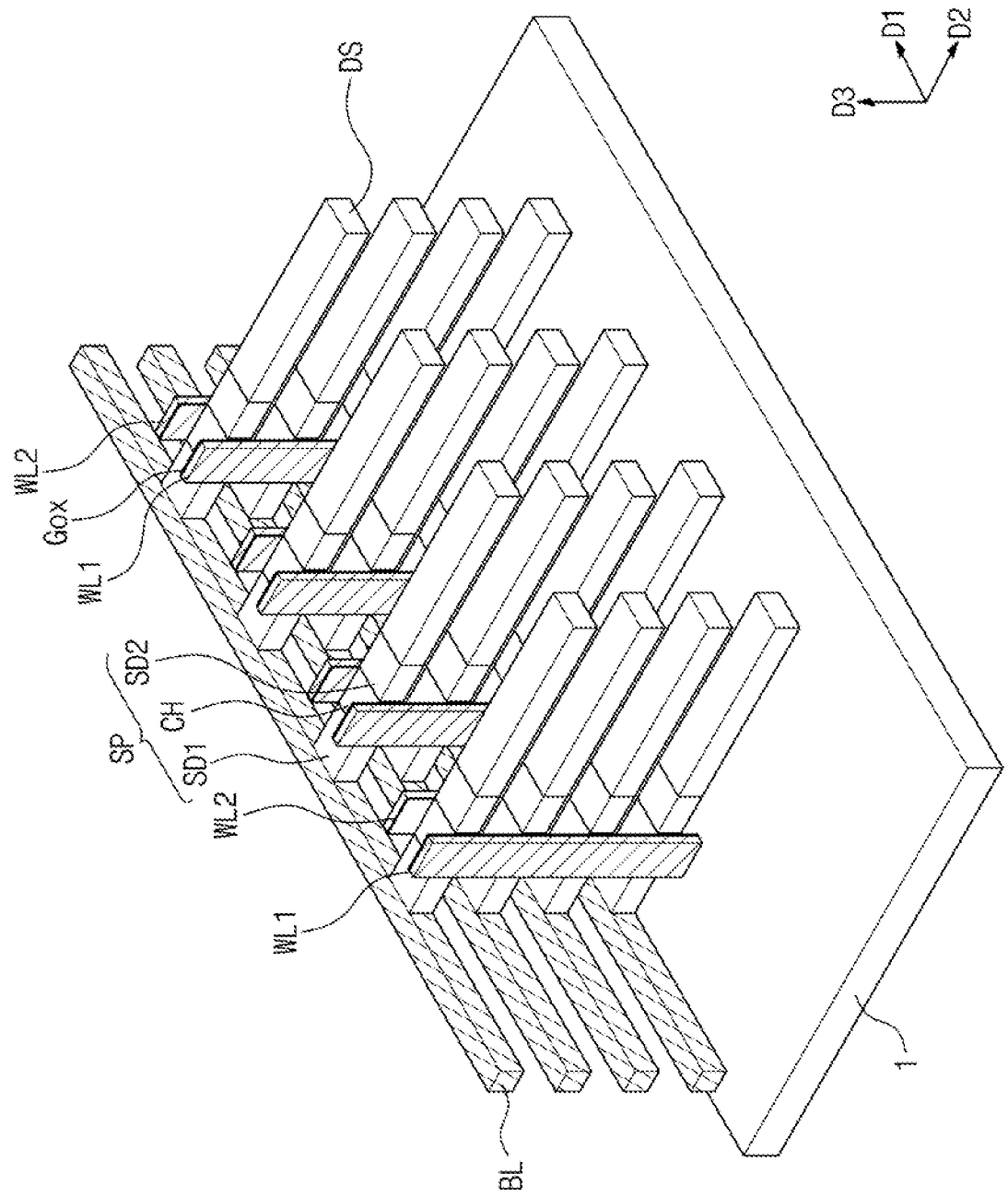
FIG. 2 is a perspective view illustrating a 3D semiconductor memory device according to embodiments of the inventive concept.

FIG. 2 is a perspective view illustrating a 3D semiconductor memory device according to embodiments of the inventive concept.

Referring to FIG. 2, first conductive lines and second conductive lines intersecting the first conductive lines may be provided on a semiconductor substrate 1. In some embodiments of the inventive concept, the first conductive lines may be bit lines BL, and the second conductive lines may be word lines WL1 and WL2. In certain embodiments of the inventive concept, the first conductive lines may be word lines WL1 and WL2, and the second conductive lines may be bit lines BL.

The semiconductor substrate 1 may include a semiconductor material. For example, the semiconductor substrate 1 may be a silicon substrate, a germanium substrate, or a silicon-germanium substrate.

The bit lines BL may intersect the word lines WL1 and WL2. The bit lines BL may extend in parallel to each other in a first direction D1 parallel to a top surface of the semiconductor substrate 1, and the word lines WL1 and WL2 may extend in parallel to each other in a third direction D3 perpendicular to the top surface of the semiconductor substrate 1.

The bit lines and the word lines BL, WL1 and WL2 may include at least one of a doped semiconductor material (e.g., doped silicon or doped germanium), a conductive metal nitride (e.g., titanium nitride or tantalum nitride), a metal (e.g., tungsten, titanium, or tantalum), or a metal-semiconductor compound (e.g., tungsten silicide, cobalt silicide, or titanium silicide).

Memory cells may be provided at intersection points of the bit lines BL and the word lines WL1 and WL2, respectively. Each of the memory cells may include a selection element SW and a data storage element DS, as described above. In other words, each of the memory cells may include a transistor and a capacitor.

The selection element SW may include a semiconductor pattern SP. The semiconductor pattern SP may have a bar shape having a long axis in a second direction D2. In other words, the semiconductor pattern SP may extend lengthwise in the second direction D2. The semiconductor pattern SP may include first and second source/drain regions SD1 and SD2 and a channel region CH between the first and second source/drain regions SD1 and SD2.

The semiconductor patterns SP of the memory cells may be stacked in the third direction D3 and may be spaced apart from each other in the first direction D1 and the second direction D2. In other words, the semiconductor patterns SP may be three-dimensionally arranged on the semiconductor substrate 1.

The semiconductor patterns SP may include at least one of silicon or germanium. First and second end portions of each of the semiconductor patterns SP may be doped with dopants. Alternatively, the semiconductor patterns SP may include an oxide semiconductor material. For example, the oxide semiconductor material may include at least one of indium (In), gallium (Ga), zinc (Zn), or tin (Sn). The oxide semiconductor material may be indium-gallium-zinc oxide (IGZO) including indium (In), gallium (Ga) and zinc (Zn).

In some embodiments of the inventive concept, each of the bit lines BL may be connected to the first source/drain regions SD1 of the semiconductor patterns SP arranged in the first direction D1. The bit lines BL may be stacked in the third direction D3 perpendicular to the top surface of the semiconductor substrate 1.

The data storage element DS may be connected to the second source/drain region SD2 of each of the semiconductor patterns SP. The data storage elements DS may be provided at substantially the same levels as their corresponding semiconductor patterns SP. In some embodiments of the inventive concept, the data storage element DS may include a capacitor, and a storage electrode of the capacitor may be connected to the second end portion of each of the semiconductor patterns SP.

A pair of the word lines WL1 and WL2 may be disposed on the semiconductor substrate 1 with each of the semiconductor patterns SP interposed therebetween. The pair of word lines WL1 and WL2 may intersect both sidewalls of the semiconductor patterns SP stacked in the third direction D3. In other words, the pair of word lines WL1 and WL2 may be arranged on opposite sides of the semiconductor patterns SP stacked in the third direction D3. The word lines WL1 and WL2 may be adjacent to the channel regions CH of the semiconductor patterns SP.

A gate insulating pattern Gox may be disposed between the sidewalls of the semiconductor patterns SP and the word lines WL1 and WL2. The gate insulating pattern Gox may include at least one of a high-k dielectric layer, a silicon oxide layer, a silicon nitride layer, or a silicon oxynitride layer. For example, the high-k dielectric layer may include at least one of hafnium oxide, hafnium-silicon oxide, lanthanum oxide, zirconium oxide, zirconium-silicon oxide, tantalum oxide, titanium oxide, barium-strontium-titanium oxide, barium-titanium oxide, strontium-titanium oxide, lithium oxide, aluminum oxide, lead-scandium-tantalum oxide, or lead-zinc niobate.

Figure 3:
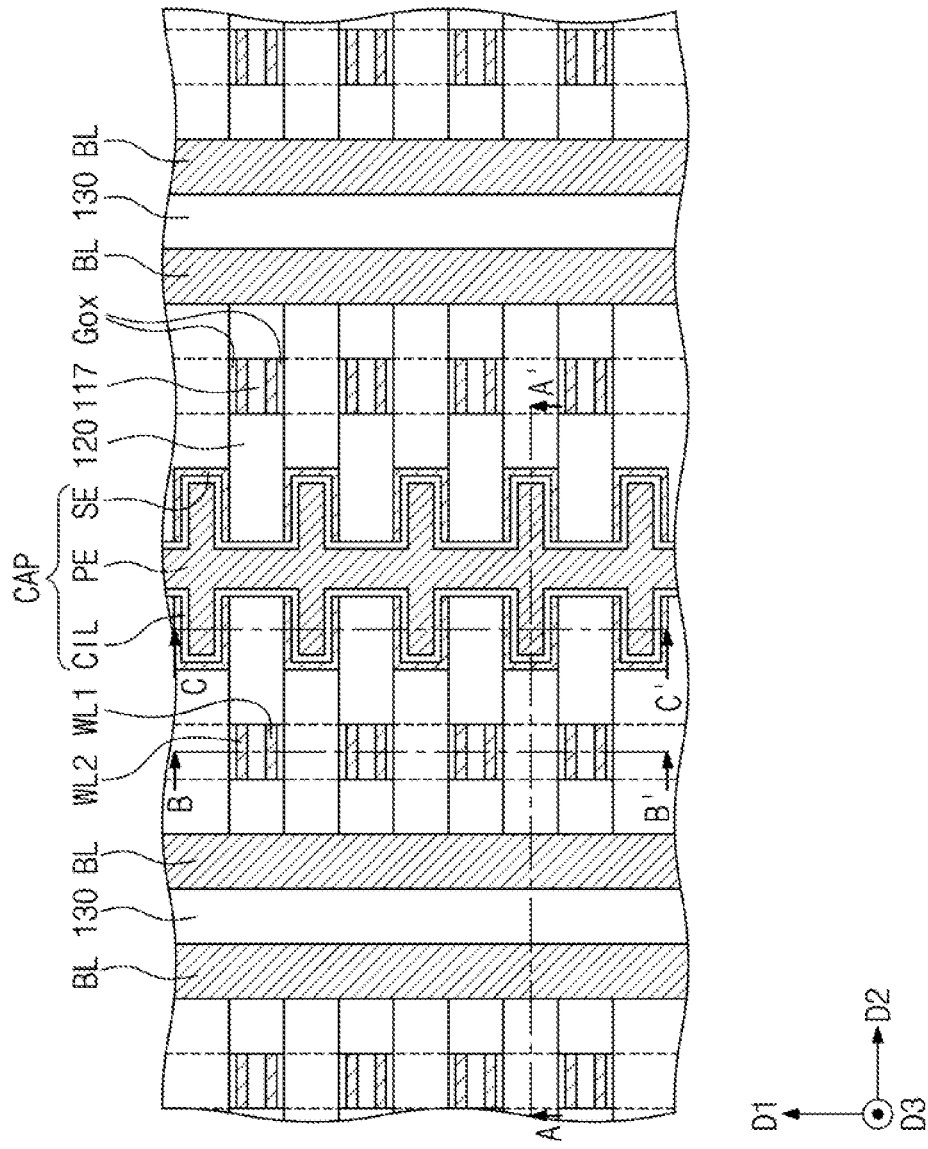
FIG. 3 is a plan view illustrating a 3D semiconductor memory device according to embodiments of the inventive concept.
Figure 4:
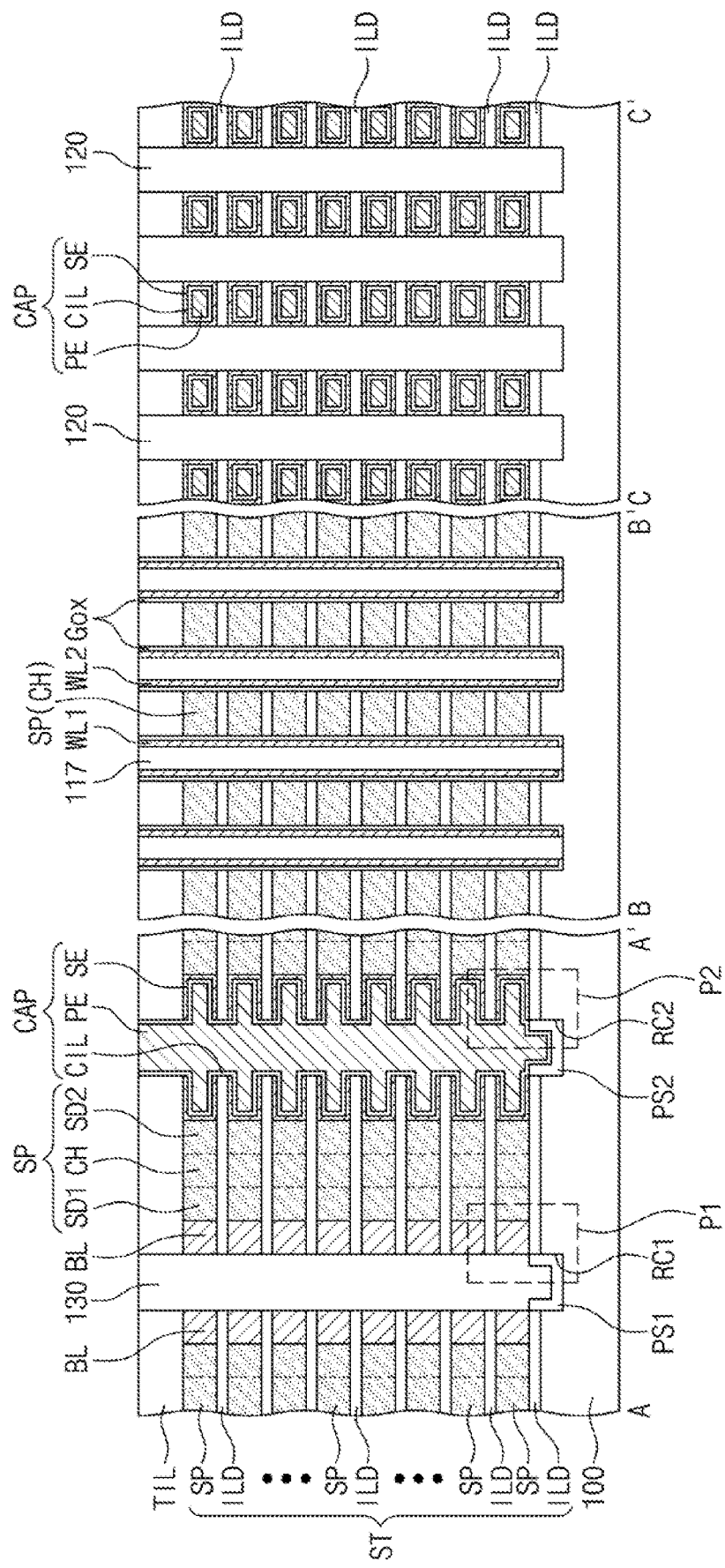
FIG. 4 is a cross-sectional view taken along lines A-A', B-B' and C-C' of FIG. 3 to illustrate a 3D semiconductor memory device according to embodiments of the inventive concept.
Figure 5A:
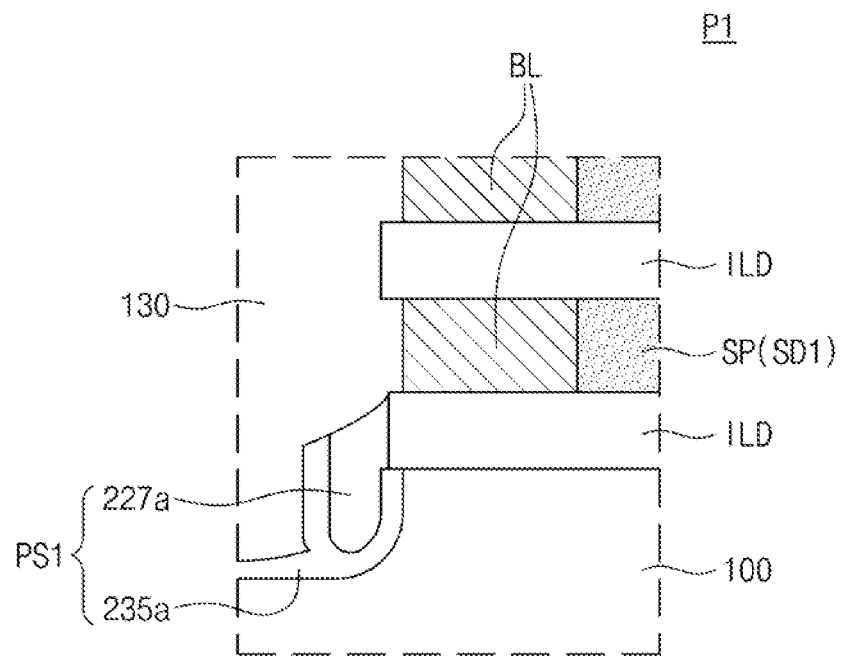
FIGS. 5A and 5C are enlarged views of a portion 'P1' of FIG. 4.
Figure 5B:
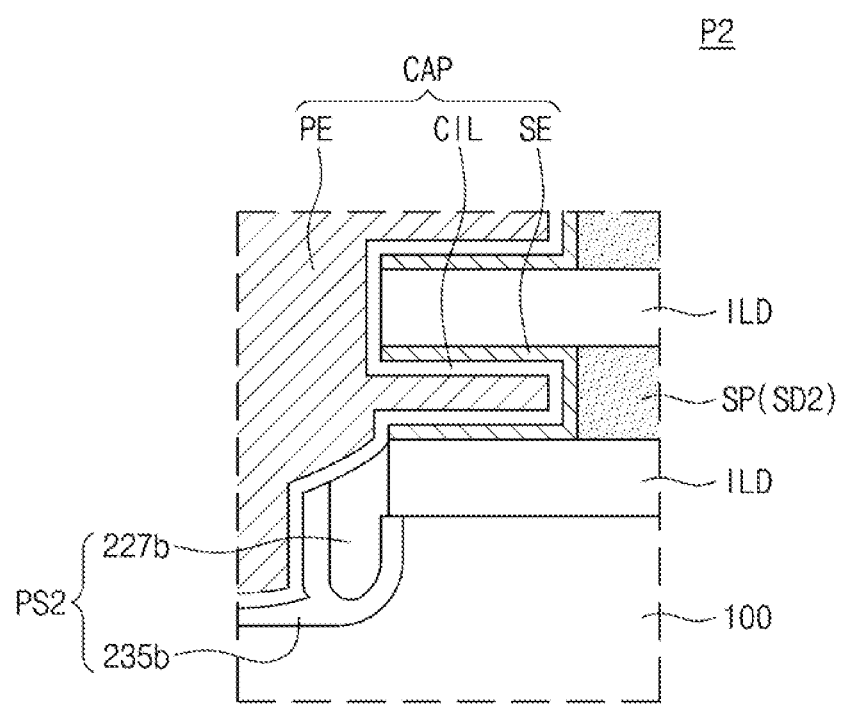
FIG. 5B is an enlarged view of a portion 'P2' of FIG. 4.
Figure 5C:
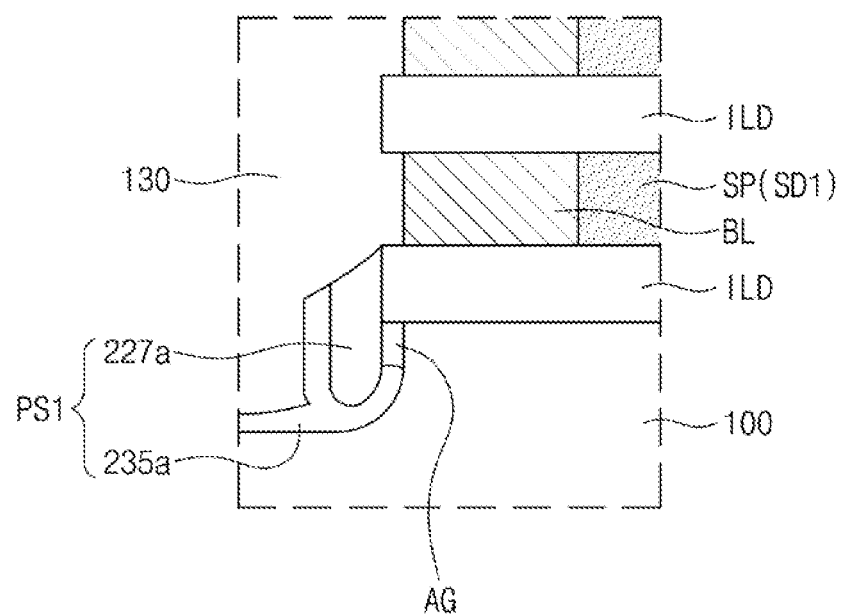

FIG. 3 is a plan view illustrating a 3D semiconductor memory device according to embodiments of the inventive concept. FIG. 4 is a cross-sectional view taken along lines A-A', B-B' and C-C' of FIG. 3 to illustrate a 3D semiconductor memory device according to embodiments of the inventive concept. FIGS. 5A and 5C are enlarged views of a portion 'P1' of FIG. 4, and FIG. 5B is an enlarged view of a portion 'P2' of FIG. 4.

Referring to FIGS. 3 and 4, stack structures ST may be disposed on a semiconductor substrate 100. Each of the stack structures ST may include interlayer insulating layers ILD and semiconductor patterns SP, which are alternately stacked. The stack structures ST may be spaced apart from each other in the first direction D1 and the second direction D2 on the semiconductor substrate 100.

The semiconductor substrate 100 may include a semiconductor material. For example, the semiconductor substrate 100 may be a single-crystalline silicon substrate or a silicon-on-insulator (SOI) substrate. The semiconductor patterns SP may include the same semiconductor material as the semiconductor substrate 100. The semiconductor patterns SP may include poly-crystalline silicon or single-crystalline silicon. Each of the interlayer insulating layers ILD may include at least one of a silicon oxide layer or a silicon nitride layer.

In each of the stack structures ST, each of the semiconductor patterns SP may have a bar shape having a long axis in the second direction D2, as described above. Each of the semiconductor patterns SP may include first and second source/drain regions SD1 and SD2 spaced apart from each other and a channel region CH between the first and second source/drain regions SD1 and SD2. Each of the semiconductor patterns SP may have a first sidewall and a second sidewall, which are opposite to each other in the first direction D1.

Word lines WL1 and WL2 as first conductive patterns may be disposed on the semiconductor substrate 100. The word lines WL1 and WL2 may extend in the third direction D3 to intersect the stack structures ST. The word lines WL1 and WL2 may intersect the first and second sidewalls of the semiconductor patterns SP. Lengths of the word lines WL1 and WL2 in the third direction D3 may be substantially equal to each other. The word lines WL1 and WL2 may be spaced apart from each other and may be arranged in the first direction D1 and the second direction D2.

The word lines may include first and second word lines WL1 and WL2. The first word line WL1 may be adjacent to the first sidewalls of the semiconductor patterns SP, and the second word line WL2 may be adjacent to the second sidewalls of the semiconductor patterns SP. The first word line WL1 may be spaced apart from the second word line WL2 with the channel regions CH interposed therebetween.

A gate insulating pattern Gox may be disposed between the stack structure ST and each of the first and second word lines WL1 and WL2. For example, the gate insulating pattern Gox may contact the channel regions CH between the first and second word lines WL1 and WL2. The gate insulating pattern Gox may extend in the third direction D3 in parallel to the first and second word lines WL1 and WL2.

The gate insulating pattern Gox may have a uniform thickness, and a portion of the gate insulating pattern Gox may be disposed between the top surface of the semiconductor substrate 100 and a bottom surface of each of the first and second word lines WL1 and WL2. The bottom surfaces of the first and second word lines WL1 and WL2 may be located at a lower level than a bottom surface of the stack structure ST. For example, the bottom surfaces of the first and second word lines WL1 and WL2 may be located below the lowermost interlayer insulating layer ILD.

At least one of a high-k dielectric pattern, a work function adjusting pattern, a ferroelectric pattern or a diffusion barrier pattern may be disposed between the gate insulating pattern Gox and each of the first and second word lines WL1 and WL2. The high-k dielectric pattern may include a material having a dielectric constant higher than that of silicon oxide, for example, a metal oxide such as hafnium oxide and/or aluminum oxide. The diffusion barrier pattern may include a metal nitride such as tungsten nitride, titanium nitride, and/or tantalum nitride.

Bit lines BL as second conductive patterns may be disposed on the semiconductor substrate 100. The bit lines BL may be spaced apart from each other in the third direction D3 by the interlayer insulating layers ILD of the stack structure ST. In other words, each of the bit lines BL may be disposed between the interlayer insulating layers ILD vertically adjacent to each other. The bit lines BL may be in contact with first end portions of the semiconductor patterns SP and may be connected to the first source/drain regions SD1. In addition, the bit lines BL may be in contact with the interlayer insulating layers ILD.

Capacitors CAP as data storage elements may be provided on the semiconductor substrate 100. A storage electrode SE of the capacitor CAP may be in contact with a second end portion of each of the semiconductor patterns SP and may be connected to the second source/drain region SD2. For example, the storage electrode SE may be in direct contact with the second end portion of the semiconductor pattern SP it is adjacent to.

The storage electrodes SE may be provided at substantially the same levels as the semiconductor patterns SP. In other words, the storage electrodes SE may be stacked in the third direction D3 and may have long axes in the second direction D2. Each of the storage electrodes SE may be disposed between the interlayer insulating layers ILD vertically adjacent to each other. In some embodiments of the inventive concept, each of the storage electrodes SE may have a hollow cylinder shape. In certain embodiments of the inventive concept, each of the storage electrodes SE may have a pillar shape having a long axis in the second direction D2. The storage electrodes SE may include at least one of a metal material, a metal nitride, or a metal silicide.

A dielectric layer CIL may conformally cover surfaces of the storage electrodes SE, and a plate electrode PE may be provided on the dielectric layer CIL. The dielectric layer CIL may include at least one of a metal oxide (e.g., hafnium oxide, zirconium oxide, aluminum oxide, lanthanum oxide, tantalum oxide, or titanium oxide), or a dielectric material having a perovskite structure (e.g., $SrTiO_3$ (STO), (Ba,Sr)$TiO_3$ (BST), $BaTiO_3$, PZT, or PLZT).

The plate electrode PE may fill the inside of the storage electrode SE in which the dielectric layer CIL is formed. The plate electrode PE may cover the storage electrodes SE spaced apart from each other in the second direction D2. The plate electrode PE may extend in the first direction D1 and the third direction D3. A portion of the plate electrode PE may be surrounded by a dielectric layer CIL and a storage electrode SE.

The semiconductor substrate 100 may have a first recess region RC1 between the bit lines BL spaced apart from each other in the second direction D2. The semiconductor substrate 100 may have a second recess region RC2 between the storage electrodes SE spaced apart from each other in the second direction D2. The first and second recess regions RC1 and RC2 may extend in parallel in the first direction D1.

A first protective structure PS1 may be provided to cover a surface of the first recess region RC1, and a second protective structure PS2 may be provided to cover a surface of the second recess region RC2. The first protective structure PS1 may be disposed at the bottom of the first recess region RC1 and the second protective structure PS2 may be disposed at the bottom of the second recess region RC2. A portion of the plate electrode PE may be disposed on the second protective structure PS2. For example, the second protective structure PS2 may be disposed between the semiconductor substrate 100 and the portion of the plate electrode PE in the second recess region RC2.

The first and second protective structures PS1 and PS2 may include an insulating material having an etch selectivity with respect to the semiconductor patterns SP. The first and second protective structures PS1 and PS2 may include the same insulating material as the interlayer insulating layers ILD. For example, the first and second protective structures PS1 and PS2 may include at least one of SiN, SiO, SiON, SiOC, or a metal oxide.

Each of the first and second protective structures PS1 and PS2 may cover a sidewall of a lowermost interlayer insulating layer ILD in contact with the top surface of the semiconductor substrate 100. The first and second protective structures PS1 and PS2 may have top surfaces located at a level between a top surface and a bottom surface of the lowermost interlayer insulating layer ILD of the interlayer insulating layers ILD. The first and second protective structures PS1 and PS2 may have rounded or curved top surfaces. These features are illustrated in detail in FIGS. 5A to 5C.

The first protective structure PS1 may include a horizontal portion covering a bottom surface of the first recess region RC1, and a sidewall portion covering a sidewall of the first recess region RC1 and the sidewall of the lowermost interlayer insulating layer ILD. Here, a thickness of the sidewall portion may be greater than a thickness of the horizontal portion. In other words, the first protective structure PS1 may be thicker on the sidewall of the first recess region RC1 than on the bottom surface of the first recess region RC1. The sidewall portion of the first protective structure PS1 may be adjacent to a lowermost bit line BL.

Likewise, the second protective structure PS2 may include a horizontal portion covering a bottom surface of the second recess region RC2 and a sidewall portion covering a sidewall of the second recess region RC2 and the sidewall of the lowermost interlayer insulating layer ILD, and a thickness of the sidewall portion may be greater than a thickness of the horizontal portion. The sidewall portion of the second protective structure PS2 may be adjacent to a lowermost storage electrode SE.

Referring to FIG. 5A, the first protective structure PS1 may include a first protective pattern 227a and a second protective pattern 235a. Each of the first and second protective patterns 227a and 235a may include at least one of SiN, SiO, SiON, SiOC, or a metal oxide. The first and second protective patterns 227a and 235a may include the same material.

The first protective pattern 227a may be spaced apart from the sidewall of the first recess region RC1 and may cover the sidewall of the lowermost interlayer insulating layer ILD. The first protective pattern 227a may have an inner sidewall facing the sidewall of the first recess region RC1 and an outer sidewall opposite to the inner sidewall.

The second protective pattern 235a may be disposed between the first protective pattern 227a and the sidewall of the first recess region RC1 and may cover the surface of the first recess region RC1. The second protective pattern 235a between the first protective pattern 227a and the sidewall of the first recess region RC1 may contact a bottom of the lowermost interlayer insulating layer ILD. The second protective pattern 235a may be in direct contact with the inner sidewall and the outer sidewall of the first protective pattern 227a.

According to an embodiment of the inventive concept illustrated in FIG. 5C, an empty space (e.g., an air gap AG or a seam) may be provided between the inner sidewall of the first protective pattern 227a and the sidewall of the first recess region RC1. The top and bottom of the empty space AG may be defined by the second protective pattern 235a and the bottom of the lowermost interlayer insulating layer ILD.

According to some embodiments of the inventive concept, the second protective structure PS2 may have substantially the same features as the first protective structure PS1. In other words, the second protective structure PS2 may include a third protective pattern 227b and a fourth protective pattern 235b, as shown in FIG. 5B.

The third protective pattern 227b may be spaced apart from the sidewall of the second recess region RC2 and may cover the sidewall of the lowermost interlayer insulating layer ILD. The third protective pattern 227b may have an inner sidewall facing the sidewall of the second recess region RC2 and an outer sidewall opposite to the inner sidewall.

The fourth protective pattern 235b may be disposed between the third protective pattern 227b and the sidewall of the second recess region RC2 and may cover the surface of the second recess region RC2. The fourth protective pattern 235b may be in direct contact with the inner sidewall and the outer sidewall of the third protective pattern 227b.

Referring back to FIGS. 3 and 4, a first filling insulation pattern 117 may be disposed between the first and second word lines WL1 and WL2. The first filling insulation pattern 117 may extend in the third direction D3 and may be in contact with the top surface of the semiconductor substrate 100.

A second filling insulation pattern 120 may be disposed between the stack structures ST adjacent to each other in the first direction D1. The second filling insulation pattern 120 may be adjacent to the first and second source/drain regions SD1 and SD2 of the semiconductor patterns SP. The second filling insulation pattern 120 may be disposed between the data storage elements (e.g., the storage electrodes SE of the capacitors CAP) adjacent to each other in the first direction D1. The second filling insulation pattern 120 may extend in the third direction D3 and may be in contact with the semiconductor substrate 100.

A third filling insulation pattern 130 may be disposed on the first protective structure PS1 and may extend in the third direction D3 to cover sidewalls of the bit lines BL. In addition, the third filling insulation pattern 130 may extend in the first direction D1.

Each of the first, second and third filling insulation patterns 117, 120 and 130 may have a single-layered or multi-layered structure including at least one of a silicon oxide layer, a silicon nitride layer, or a silicon oxynitride layer. The third filling insulation pattern 130 may include a different insulating material from that of the first protective structure PS1.

FIGS. 6A to 14A are plan views illustrating a method of manufacturing a 3D semiconductor memory device, according to embodiments of the inventive concept. FIGS. 6B to 14B are cross-sectional views taken along lines A-A', B-B' and C-C' of FIGS. 6A to 14A to illustrate a method of manufacturing a 3D semiconductor memory device, according to embodiments of the inventive concept.

Figure 6A:
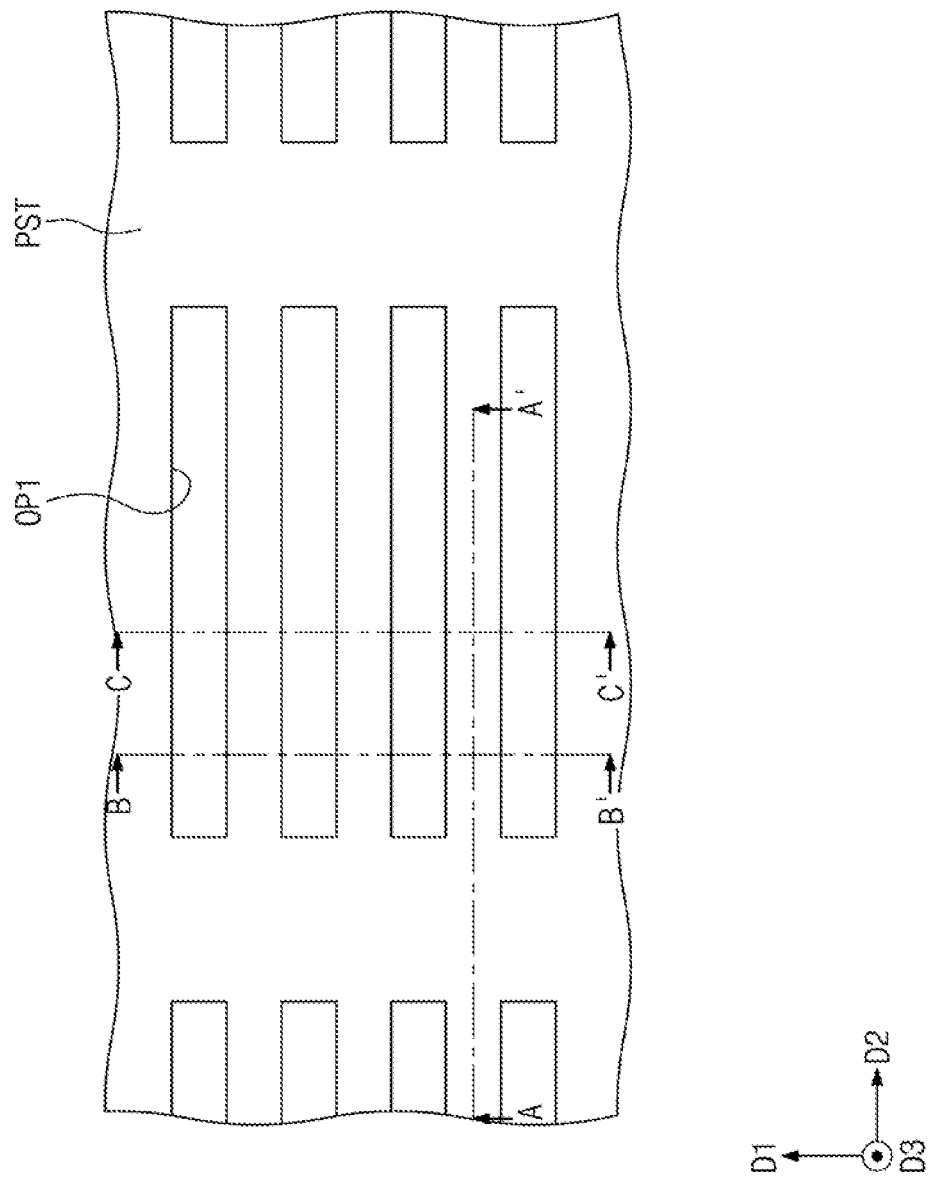
FIGS. 6A, 7A, 8A, 9A, 10A, 11A, 12A, 13A and 14A are plan views illustrating a method of manufacturing a 3D semiconductor memory device, according to embodiments of the inventive concept.
Figure 6B:
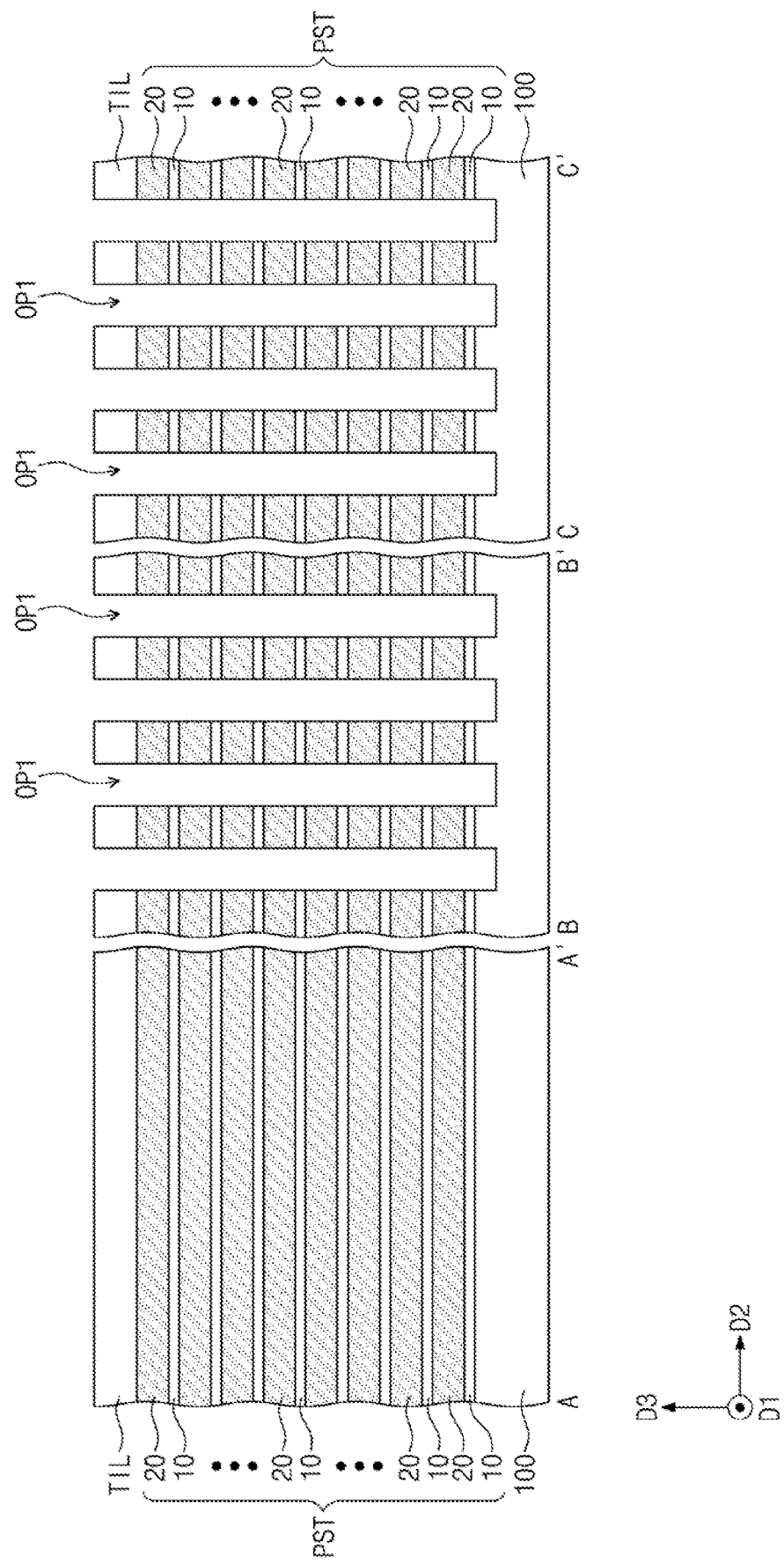
FIGS. 6B, 7B, 8B, 9B, 10B, 11B, 12B, 13B and 14B are cross-sectional views taken along lines A-A', B-B' and C-C' of FIGS. 6A to 14A to illustrate a method of manufacturing a 3D semiconductor memory device, according to embodiments of the inventive concept.

Referring to FIGS. 6A and 6B, a preliminary stack structure PST may be formed on a semiconductor substrate 100. The preliminary stack structure PST may include sacrificial layers 10 and semiconductor layers 20, which are alternately stacked.

The sacrificial layers 10 may be formed of a material having an etch selectivity with respect to the semiconductor layers 20. For example, each of the sacrificial layers 10 may be formed of at least one of a silicon-germanium layer, a silicon oxide layer, a silicon nitride layer, or a silicon oxynitride layer. For an example, each of the sacrificial layers 10 may be the silicon-germanium layer. When the preliminary stack structure PST is formed, a thickness of each of the sacrificial layers 10 may be less than a thickness of each of the semiconductor layers 20.

For example, the semiconductor layers 20 may include silicon-germanium, or indium-gallium-zinc oxide (IGZO). In some embodiments of the inventive concept, the semiconductor layers 20 may include the same semiconductor material as the semiconductor substrate 100. For example, each of the semiconductor layers 20 may be a single-crystalline silicon layer or a poly-crystalline silicon layer.

An upper insulating layer TIL covering an uppermost semiconductor layer 20 may be formed on the preliminary stack structure PST. The upper insulating layer TIL may be formed of an insulating material having an etch selectivity with respect to the sacrificial layers 10 and the semiconductor layers 20.

Next, the upper insulating layer TIL and the preliminary stack structure PST may be patterned to form first openings OP1 exposing the semiconductor substrate 100.

The first openings OP1 may have line shapes extending in parallel in the second direction D2 and may be spaced apart from each other in the first direction D1 and the second direction D2.

The formation of the first openings OP1 may include forming a mask pattern having openings corresponding to the first openings OP1 on the upper insulating layer TIL, and anisotropically etching the upper insulating layer TIL and the preliminary stack structure PST by using the mask pattern as an etch mask.

The first openings OP1 may expose a top surface of the semiconductor substrate 100, and the top surface of the semiconductor substrate 100 under the first openings OP1 may be recessed by over-etch in the anisotropic etching process. In other words, the top surface of the semiconductor substrate 100 in the first openings OP1 may be below the bottom surface of the lowermost interlayer insulating layer ILD.

Figure 7A:
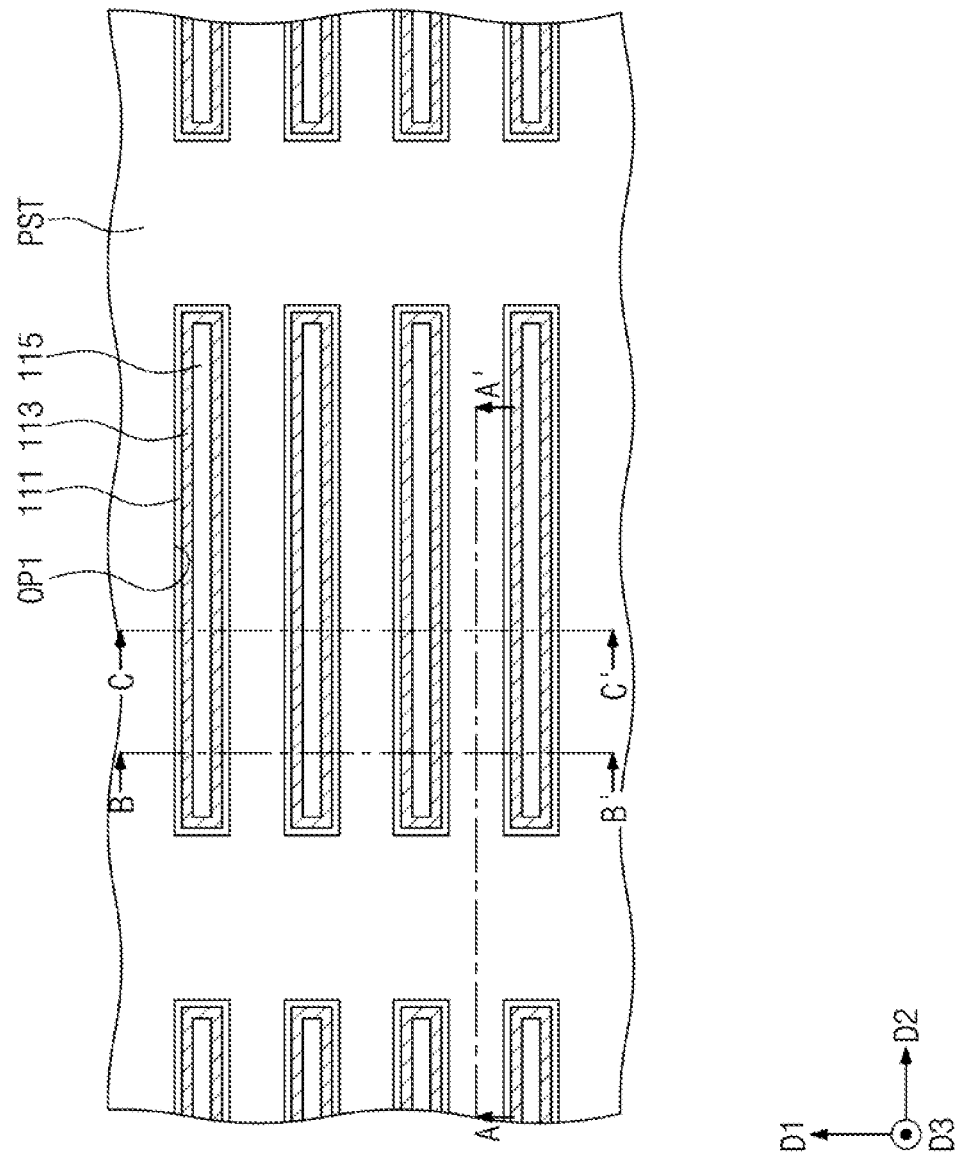
Figure 7B:
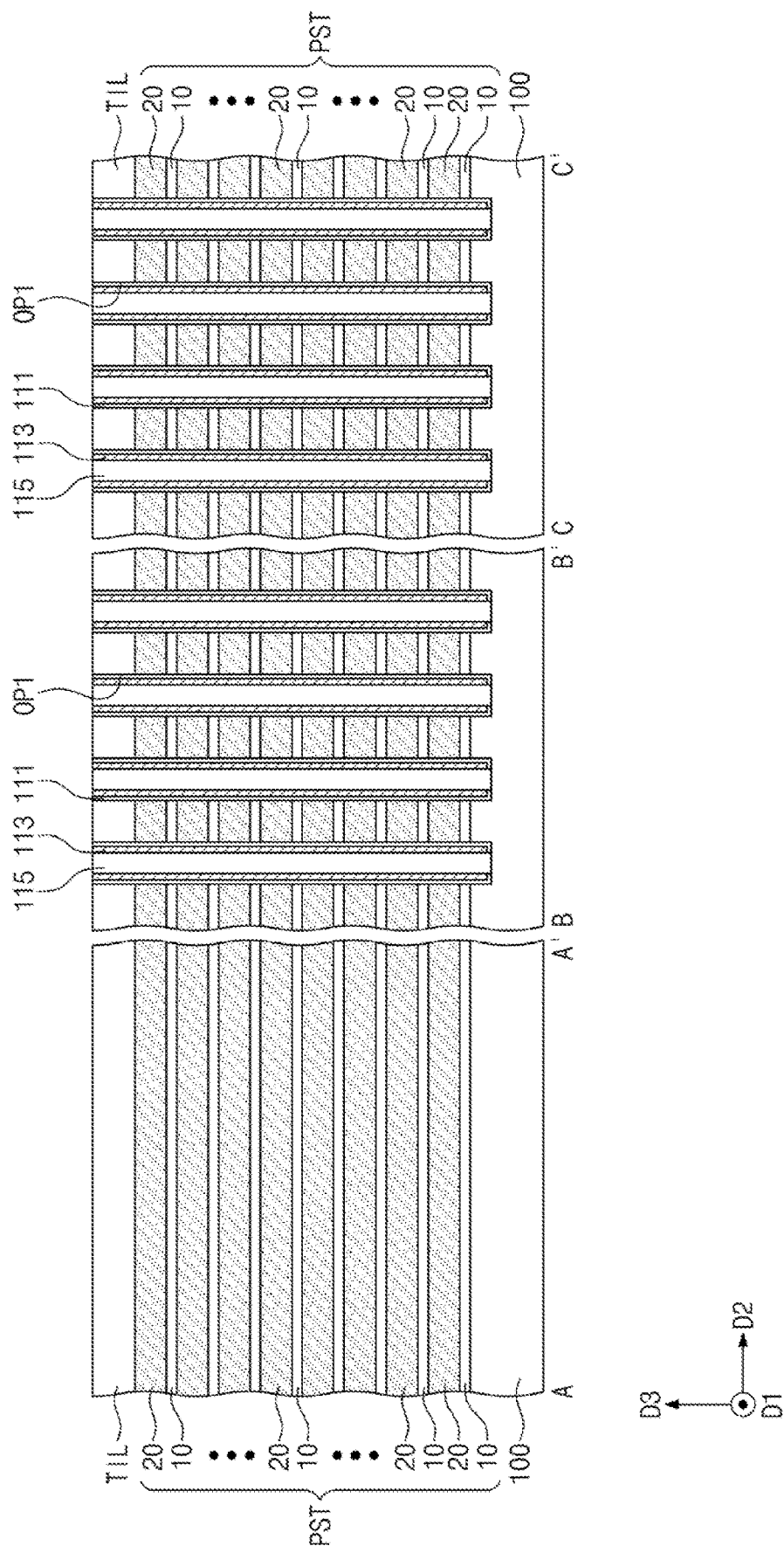

Referring to FIGS. 7A and 7B, a preliminary gate insulating pattern 111 and a vertical conductive pattern 113 may be formed in each of the first openings OP1.

The formation of the preliminary gate insulating pattern 111 and the vertical conductive pattern 113 may include forming a preliminary gate insulating layer and a vertical conductive layer which sequentially and conformally cover an inner sidewall of each of the first openings OP1, and anisotropically etching the vertical conductive layer and the preliminary gate insulating layer to expose the top surface of the semiconductor substrate 100 at bottoms of the first openings OP1. The preliminary gate insulating pattern 111 and the vertical conductive pattern 113 may have closed loop shapes in a plan view and may define a through-hole in each of the first openings OP1. A sum of thicknesses of the preliminary gate insulating pattern 111 and the vertical conductive pattern 113 may be less than a half of a width of the first opening OP1.

The preliminary gate insulating layer may be formed using a thermal oxidation process, an atomic layer deposition (ALD) process, or a chemical vapor deposition (CVD) process. The vertical conductive layer may be formed using an ALD process or a CVD process. The preliminary gate insulating layer may include a high-k dielectric layer, a silicon oxide layer, a silicon nitride layer, a silicon oxynitride layer, or a combination thereof. The vertical conductive layer may include a metal layer and/or a metal nitride layer.

Subsequently, a first filling insulation layer 115 may be formed to fill each of the first openings OP1 in which the preliminary gate insulating patterns 111 and the vertical conductive patterns 113 are formed. The first filling insulation layer 115 may include one of a silicon oxide layer and insulating materials formed using a spin-on-glass (SOG) technique.

Figure 8A:
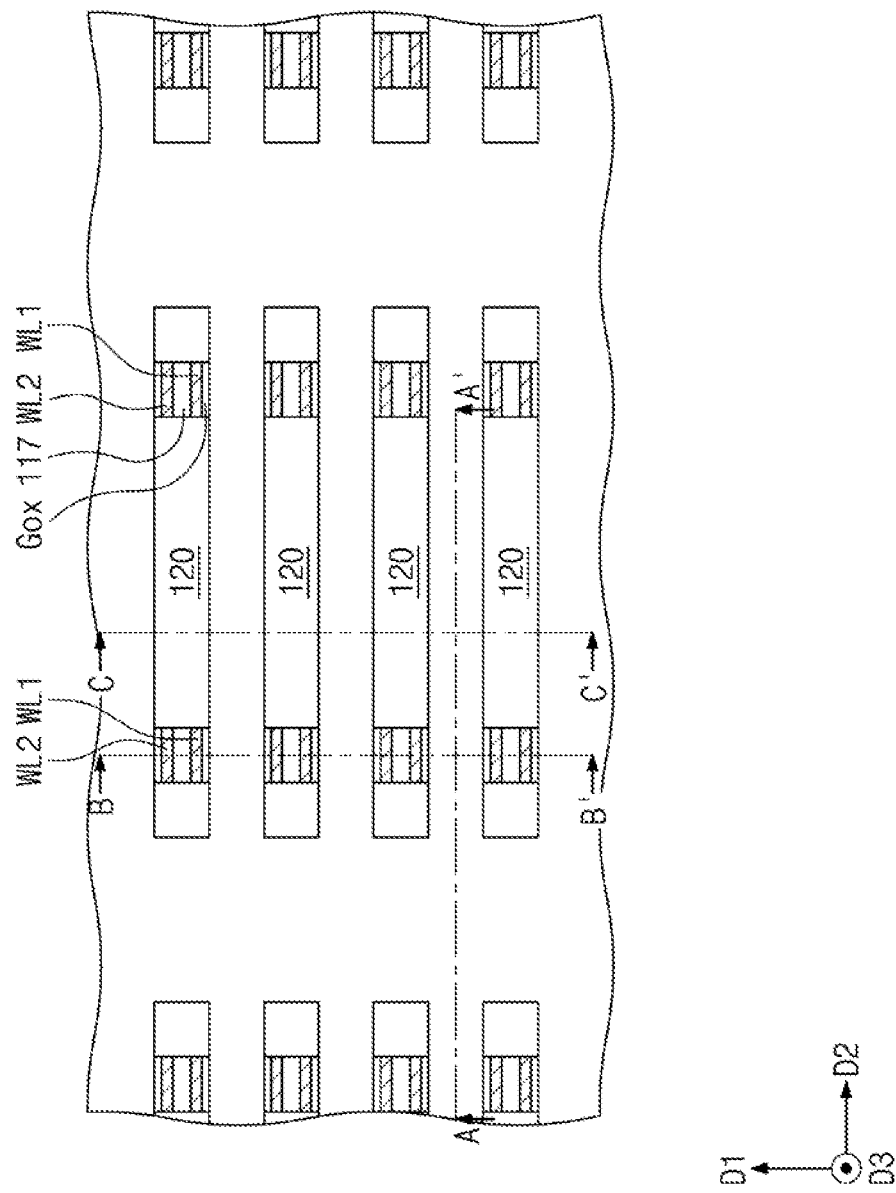
Figure 8B:
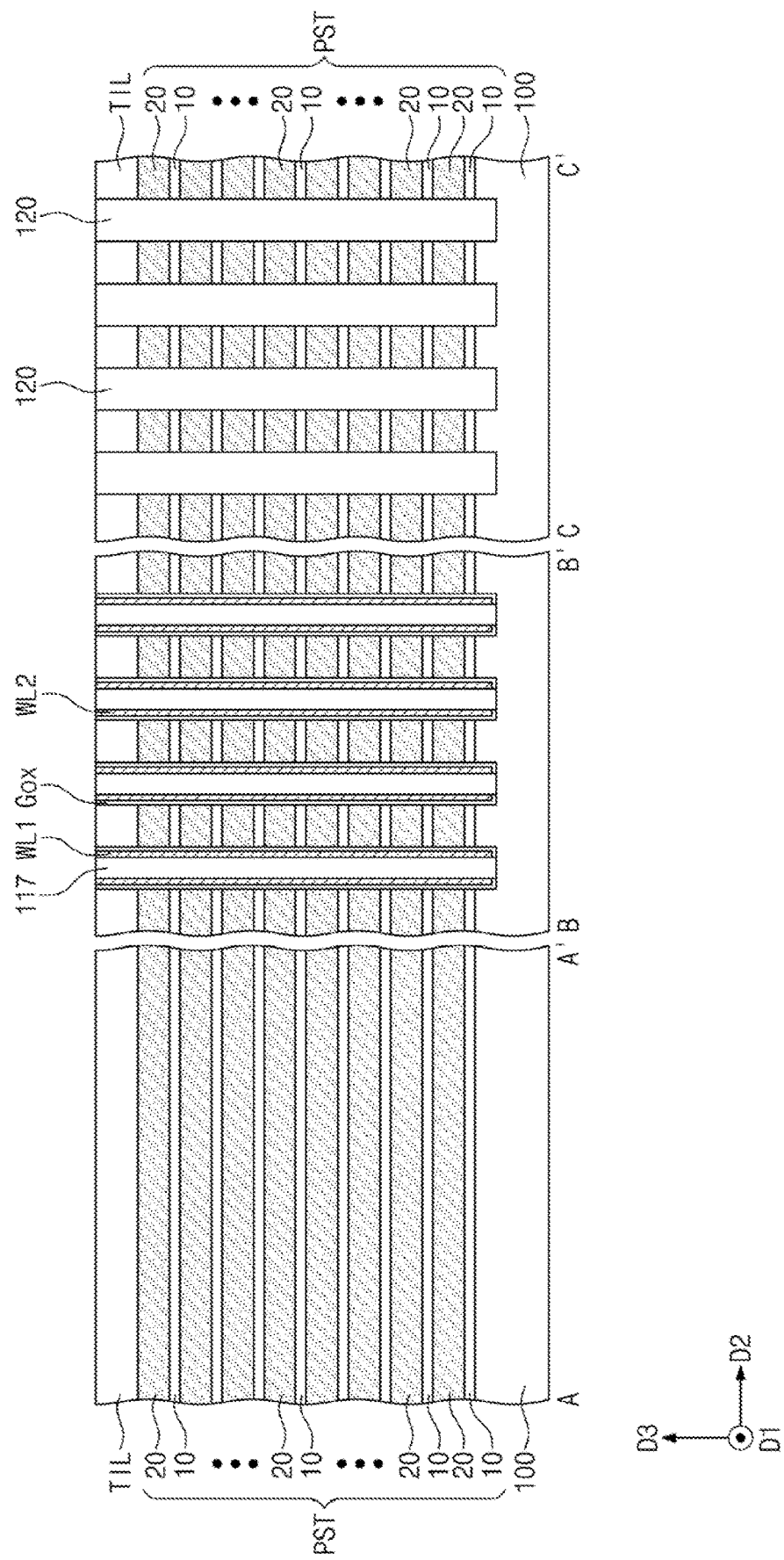

Referring to FIGS. 8A and 8B, the preliminary gate insulating pattern 111, the vertical conductive pattern 113 and the first filling insulation layer 115 may be patterned to form first and second word lines WL1 and WL2, gate insulating patterns Gox and a first filling insulation pattern 117 in each of the first openings OP1.

For example, a mask pattern extending in the first direction D1 to intersect the first openings OP1 may be formed on the preliminary stack structure PST. Subsequently, portions of the preliminary gate insulating pattern 111, the vertical conductive pattern 113 and the first filling insulation layer 115, which are exposed by the mask pattern, may be anisotropically etched to expose the semiconductor substrate 100. Thus, the gate insulating patterns Gox and the first and second word lines WL1 and WL2 may be locally formed in each of the first openings OP1.

The gate insulating patterns Gox may be formed symmetrically in the first direction D1 in each of the first openings OP1. The first and second word lines WL1 and WL2 may be spaced apart from each other in the first direction D1 in each of the first openings OP1 with the first filling insulation pattern 117 interposed therebetween. The gate insulating patterns Gox may be disposed between the first word line WL1 and the first filling insulation pattern 117 and between the second word line WL2 and the first filling insulation pattern 117.

In the above embodiments, the preliminary gate insulating layer 111 is partially etched in the anisotropic etching process for forming the first and second word lines WL1 and WL2. Alternatively, the preliminary gate insulating layer 111 may remain on the inner sidewall of the first opening OP1.

A second filling insulation pattern 120 may be formed in each of the first openings OP1 after the formation of the gate insulating patterns Gox, the first and second word lines WL1 and WL2 and the first filling insulation pattern 117.

The second filling insulation pattern 120 may fill the first opening OP1 having the first and second word lines WL1 and WL2 and the first filling insulation pattern 117 and may be in contact with the semiconductor substrate 100. In other words, the second filling insulation pattern 120 may fill a space between semiconductor patterns SP adjacent to each other in the first direction D1. The second filling insulation pattern 120 may include one of a silicon oxide layer and insulating materials formed using a spin-on-glass (SOG) technique.

Figure 9A:
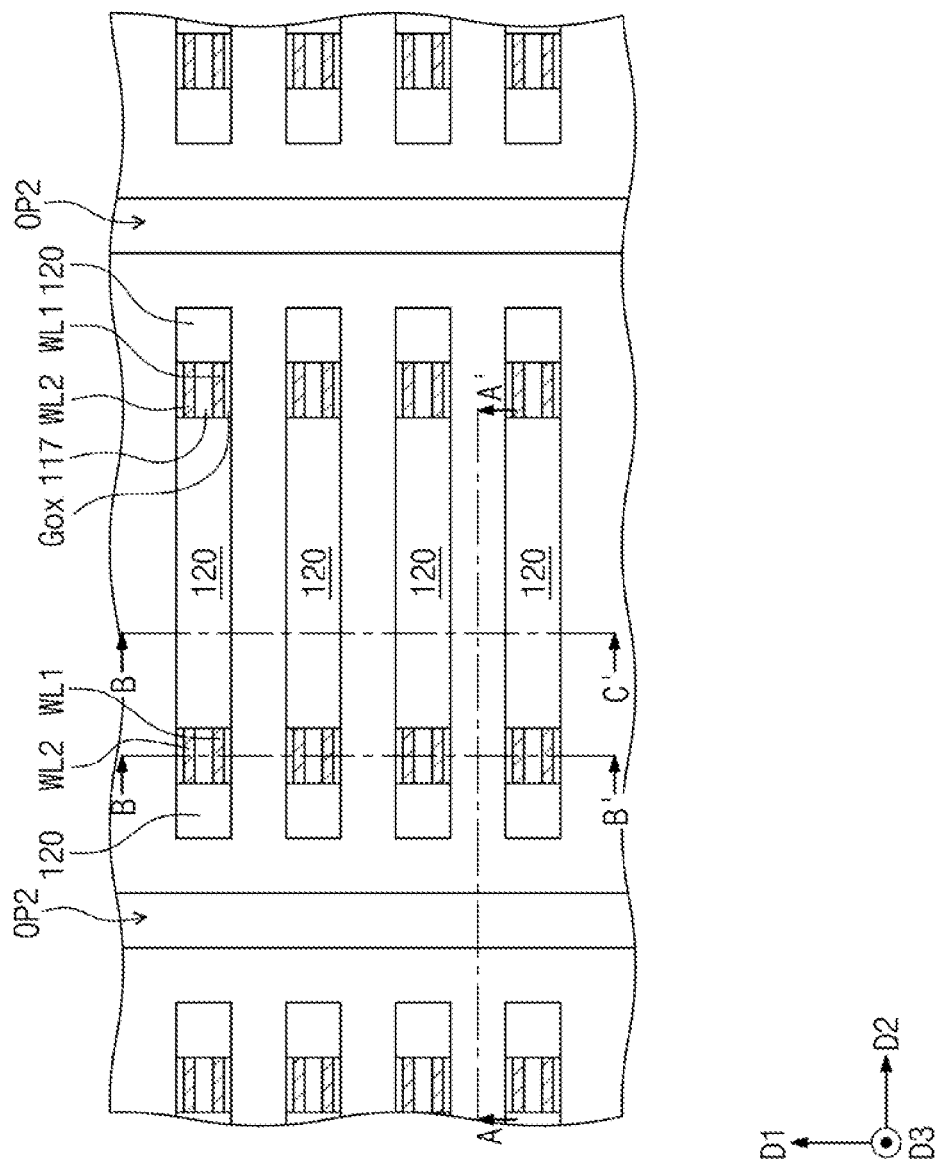
Figure 9B:
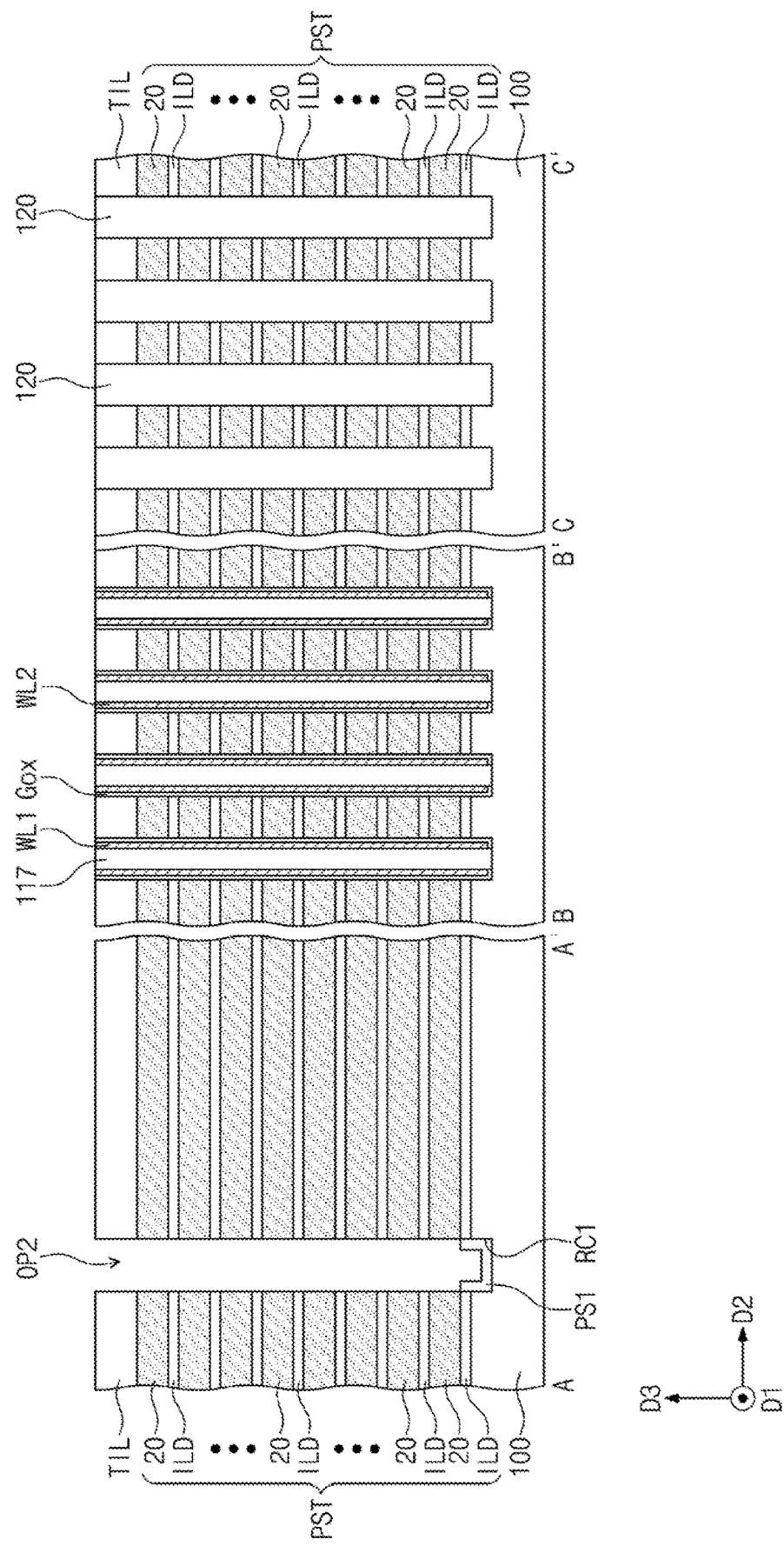

Referring to FIGS. 9A and 9B, second openings OP2 may be formed to penetrate the preliminary stack structure PST. The second openings OP2 may expose sidewalls of the sacrificial layers 10 and sidewalls of the semiconductor layers 20. The second openings OP2 may extend in the first direction D1 and may be spaced apart from the first openings OP1.

The formation of the second openings OP2 may include forming a mask pattern having openings corresponding to the second openings OP2 on the preliminary stack structure PST, and anisotropically etching the preliminary stack structure PST using the mask pattern as an etch mask. The second openings OP2 may expose the top surface of the semiconductor substrate 100, and the top surface of the semiconductor substrate 100 under the second openings OP2 may be recessed by over-etch in the anisotropic etching process to form first recess regions RC1. For example, the top surface of the semiconductor substrate 100 in the second opening OP2 may be disposed below the bottom surface of the lowermost interlayer insulating layer ILD.

Next, the sacrificial layers 10 exposed by the second openings OP2 may be replaced with interlayer insulating layers ILD. A method of replacing the sacrificial layers 10 with the interlayer insulating layers ILD will be described later in more detail with reference to FIGS. 15 to 19.

After the formation of the interlayer insulating layers ILD, a first protective structure PS1 may be formed to cover a surface (e.g., an inner surface) of the first recess region RC1 exposed by the second opening OP2. The first protective structure PS1 may include an insulating material having an etch selectivity with respect to the semiconductor layers 20. A method of forming the first protective structure PS1 will be described later in more detail with reference to FIGS. 19 to 27.

Figure 10A:
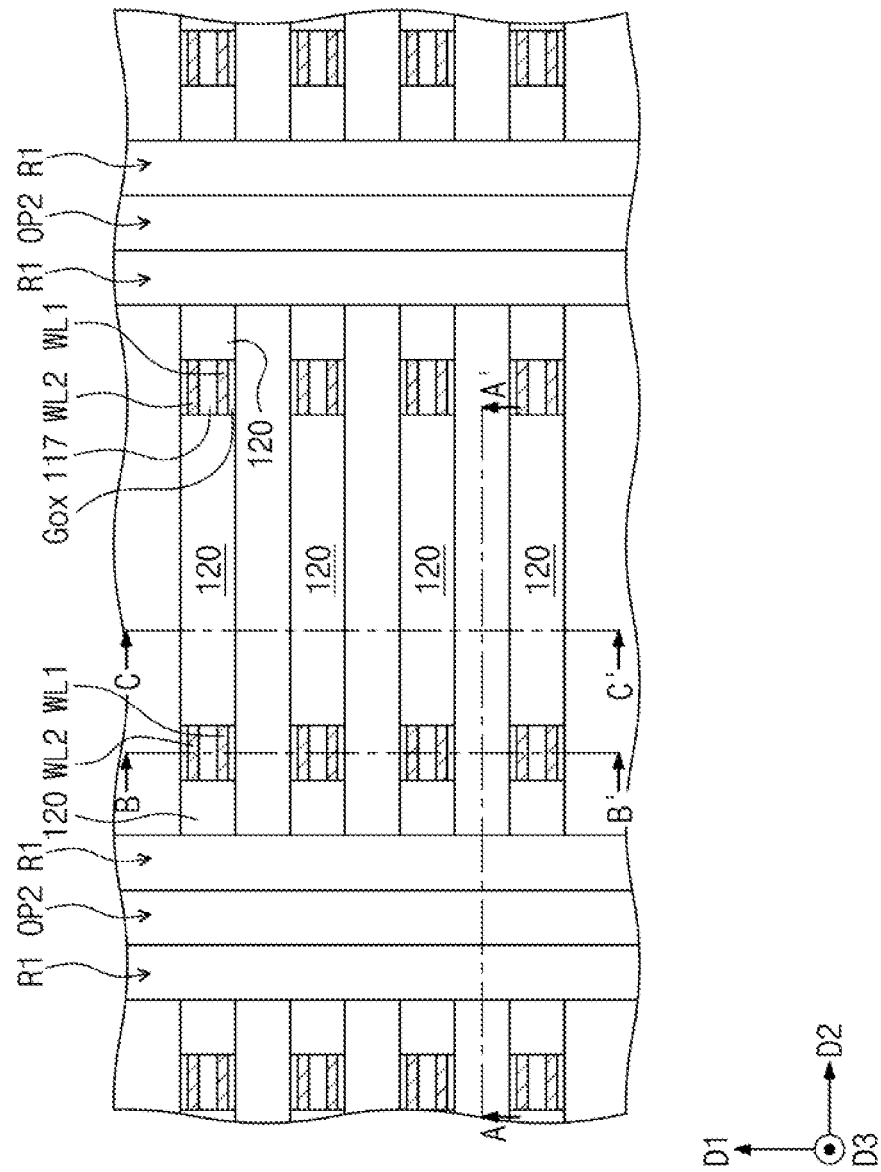
Figure 10B:
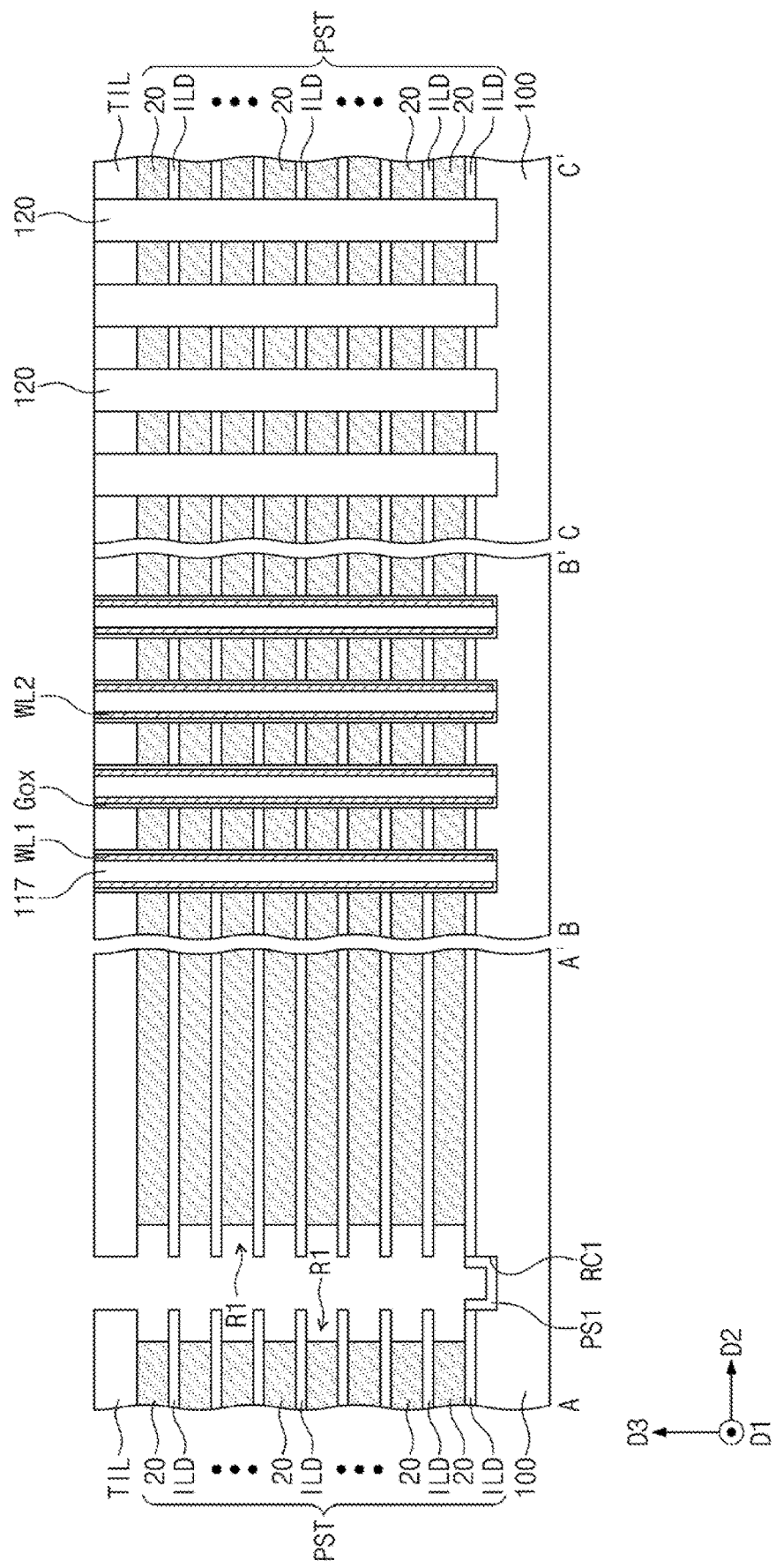

Referring to FIGS. 10A and 10B, first horizontal recess regions R1 may be formed between the interlayer insulating layers ILD by selectively removing portions of the semiconductor layers 20 exposed by the second openings OP2.

The formation of the first horizontal recess regions R1 may include etching the portions of the semiconductor layers 20 by performing an etching process having an etch selectivity with respect to the interlayer insulating layers ILD and the first protective structure PS1.

Each of the first horizontal recess regions R1 may be formed between the interlayer insulating layers ILD vertically adjacent to each other. The first horizontal recess regions R1 may extend in the first direction D1 and may expose portions of sidewalls of the second filling insulation patterns 120 and sidewalls of the semiconductor layers 20.

The semiconductor substrate 100 may be protected by the first protective structure PS1 during the formation of the first horizontal recess regions R1. For example, the first protective structure PS1 may cover the semiconductor substrate 100 in each of the second openings OP2. Thus, it is possible to prevent a sigma-shaped undercut region from being formed under the stack structure ST by etching of a portion of the semiconductor substrate 100 during the process of isotropically etching the semiconductor layers 20.

Next, portions of the semiconductor layers 20 exposed by the first horizontal recess regions R1 may be doped with dopants. Thus, first source/drain regions SD1 may be formed in the semiconductor layers 20.

Figure 11A:
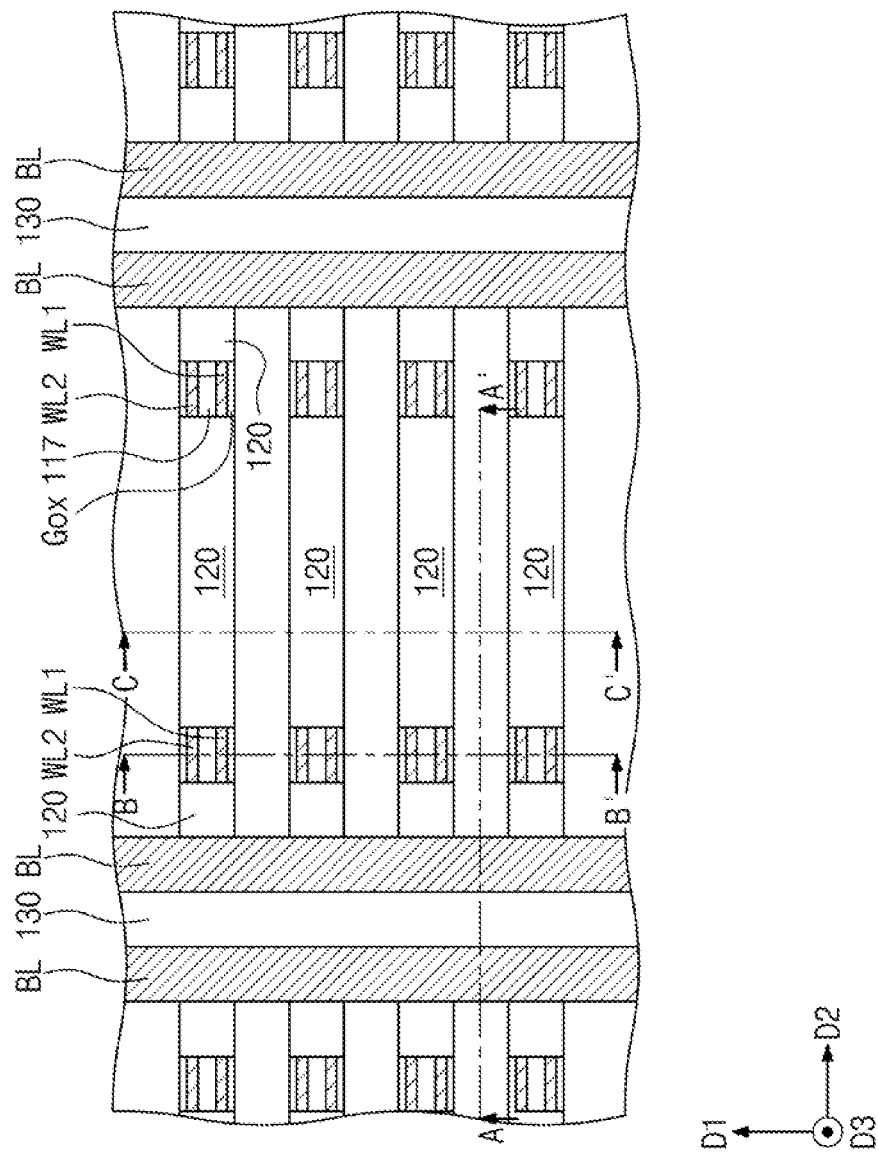
Figure 11B:
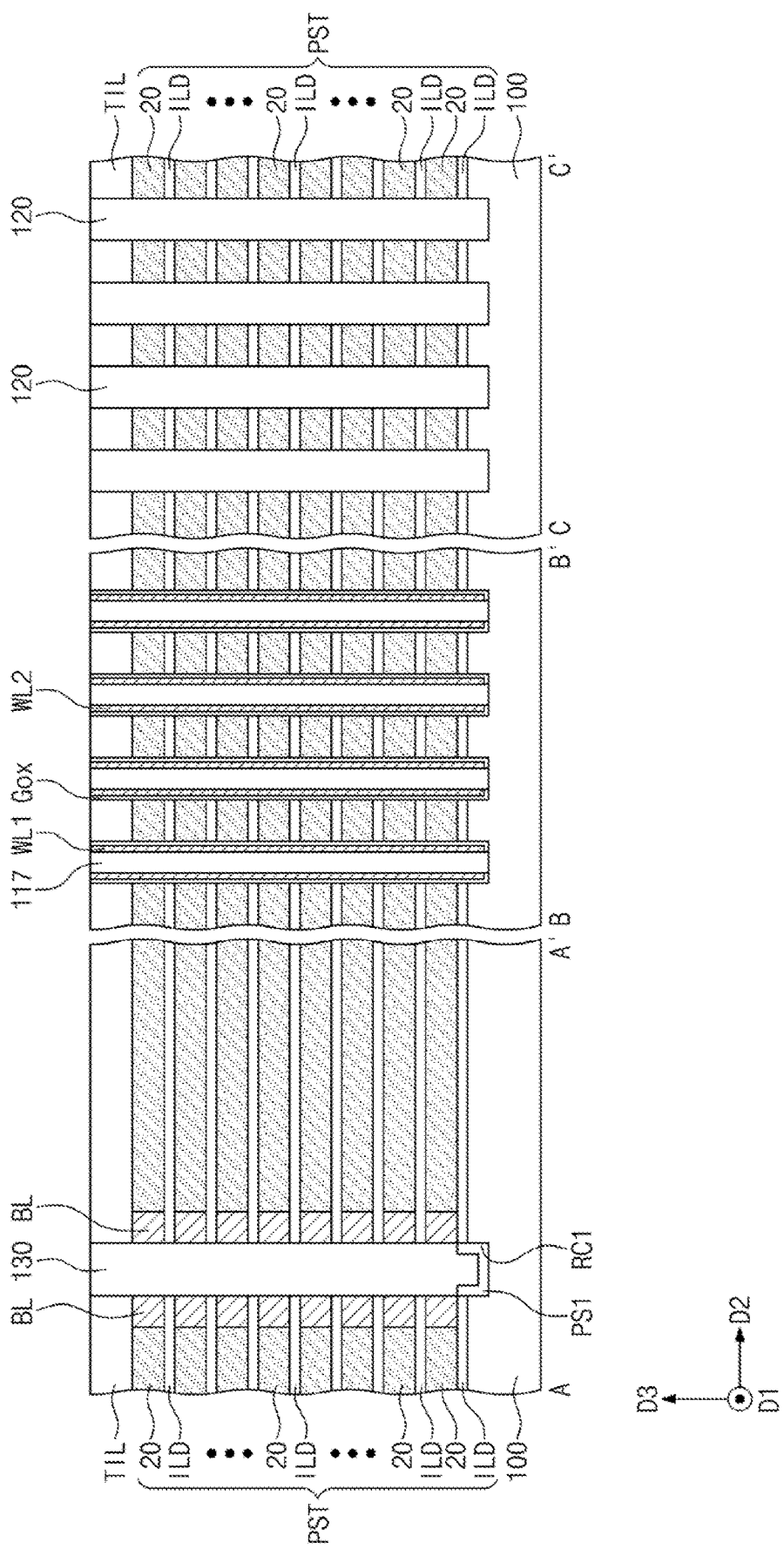

Referring to FIGS. 11A and 11B, first conductive patterns (e.g., bit lines BL) may be formed to fill the first horizontal recess regions R1, respectively.

The formation of the bit lines BL may include depositing a conductive layer filling the first horizontal recess regions R1 and portions of the second openings OP2, and removing the conductive layer disposed in the second openings OP2 while leaving portions of the conductive layer in the first horizontal recess regions R1. The conductive layer may include at least one of doped silicon, metal materials, metal nitrides, or metal silicides. For example, the conductive layer may include tantalum nitride or tungsten.

The bit lines BL may extend in the first direction D1 and may be separated from each other in the third direction D3 by the interlayer insulating layers ILD. The bit lines BL may be in contact with the first source/drain regions SD1 of the semiconductor layers 20.

After the formation of the bit lines BL, third filling insulation patterns 130 may be formed to fill the second openings OP2. The third filling insulation pattern 130 may separate the bit lines BL from each other in the second direction D2. In other words, the third filling insulation pattern 130 may be disposed between a pair of bit lines BL in the second direction D2. The formation of the third filling insulation pattern 130 may include forming a third filling insulation layer filling the second opening OP2 in which the first protective structure PS1 is formed, and etching the third filling insulation layer to expose a top surface of the upper insulating layer TIL. The third filling insulation pattern 130 may be formed of at least one of a silicon oxide layer, a silicon nitride layer, or a silicon oxynitride layer, and the etching of the third filling insulation layer may be performed using a planarization technique such as a chemical mechanical polishing (CMP) technique or an etch-back technique. The third filling insulation pattern 130 may be in contact with the first protective structure PS1 at the bottom of the second opening OP2.

Figure 12A:
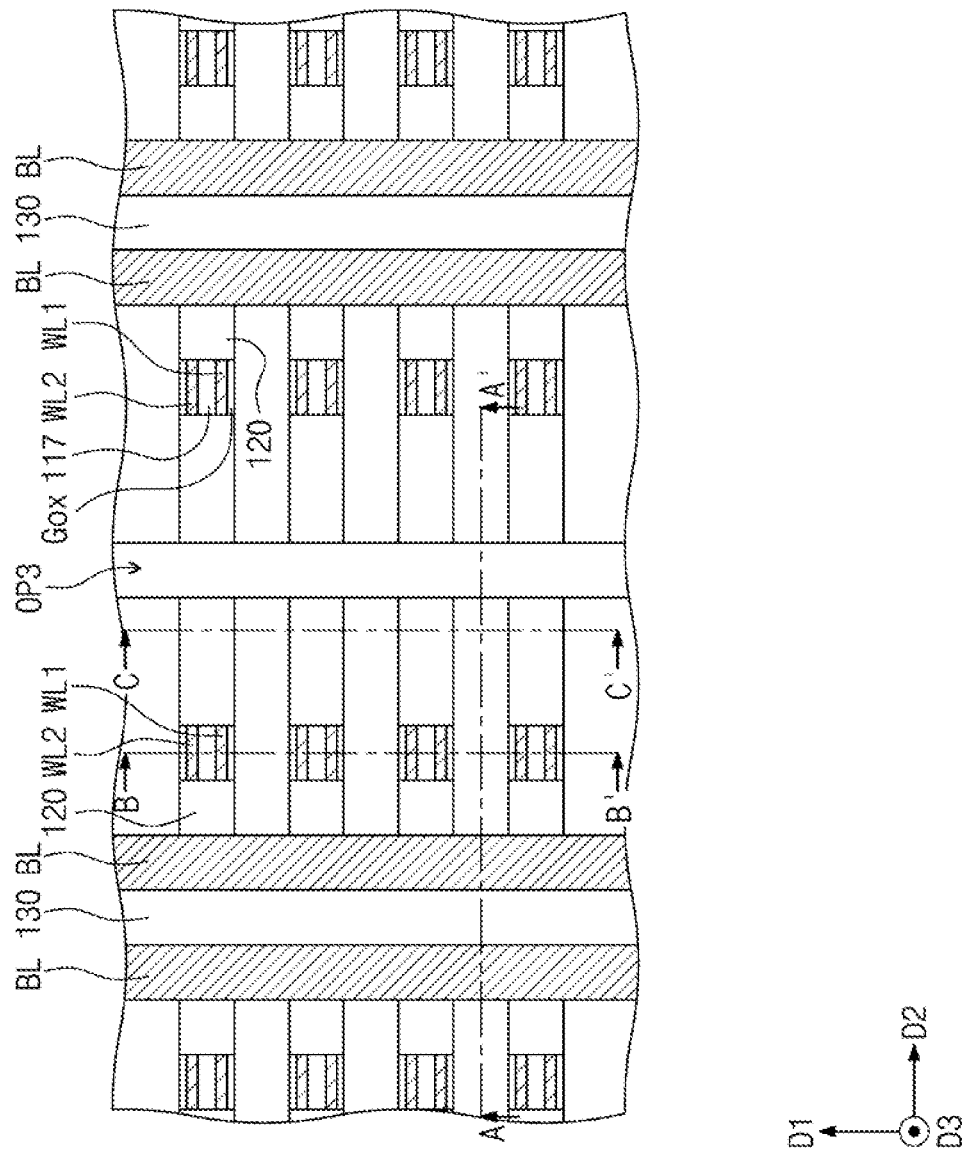
Figure 12B:
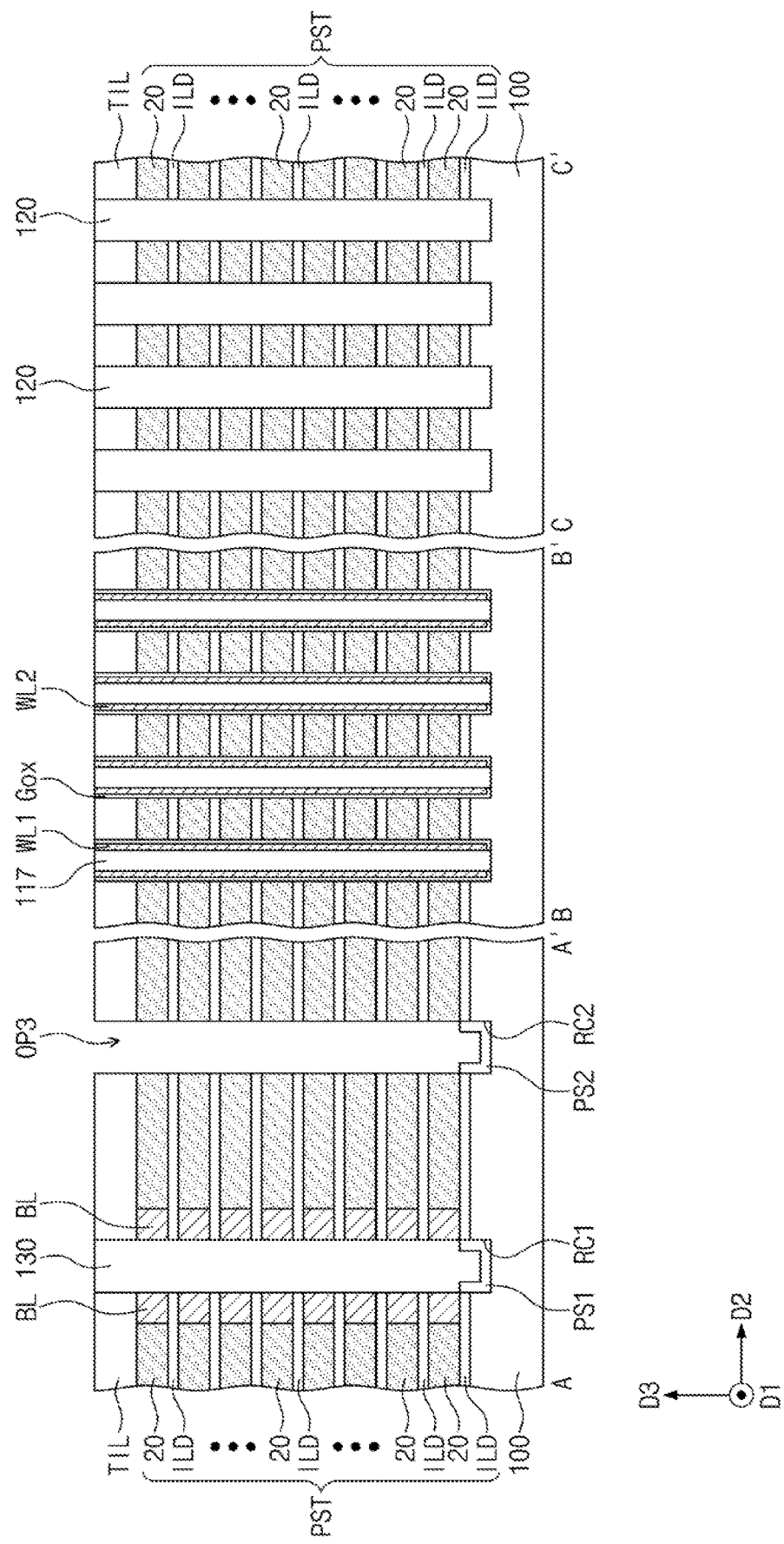

Referring to FIGS. 12A and 12B, a third opening OP3 intersecting the second filling insulation patterns 120 and penetrating the preliminary stack structure PST may be formed. The third opening OP3 may be formed between a pair of the third filling insulation patterns 130. The third opening OP3 may extend in the first direction D1 and may expose sidewalls of the second filling insulation patterns 120, sidewalls of the interlayer insulating layers ILD and sidewalls of the semiconductor layers 20.

The formation of the third opening OP3 may include forming a mask pattern having an opening corresponding to the third opening OP3 on the stack structure ST, and anisotropically etching the preliminary stack structure PST using the mask pattern as an etch mask. The third opening OP3 may expose the top surface of the semiconductor substrate 100, and the top surface of the semiconductor substrate 100 under the third opening OP3 may be recessed by over-etch in the anisotropic etching process to form a second recess region RC2.

Next, a second protective structure PS2 may be formed to cover a surface (e.g., an inner surface) of the second recess region RC2 exposed by the third opening OP3. For example, the second protective structure PS2 may cover the entire second recess region RC2. The second protective structure PS2 may include an insulating material having an etch selectivity with respect to the semiconductor layers 20. A method of forming the second protective structure PS2 will be described later in more detail with reference to FIGS. 19 to 27.

Figure 13A:
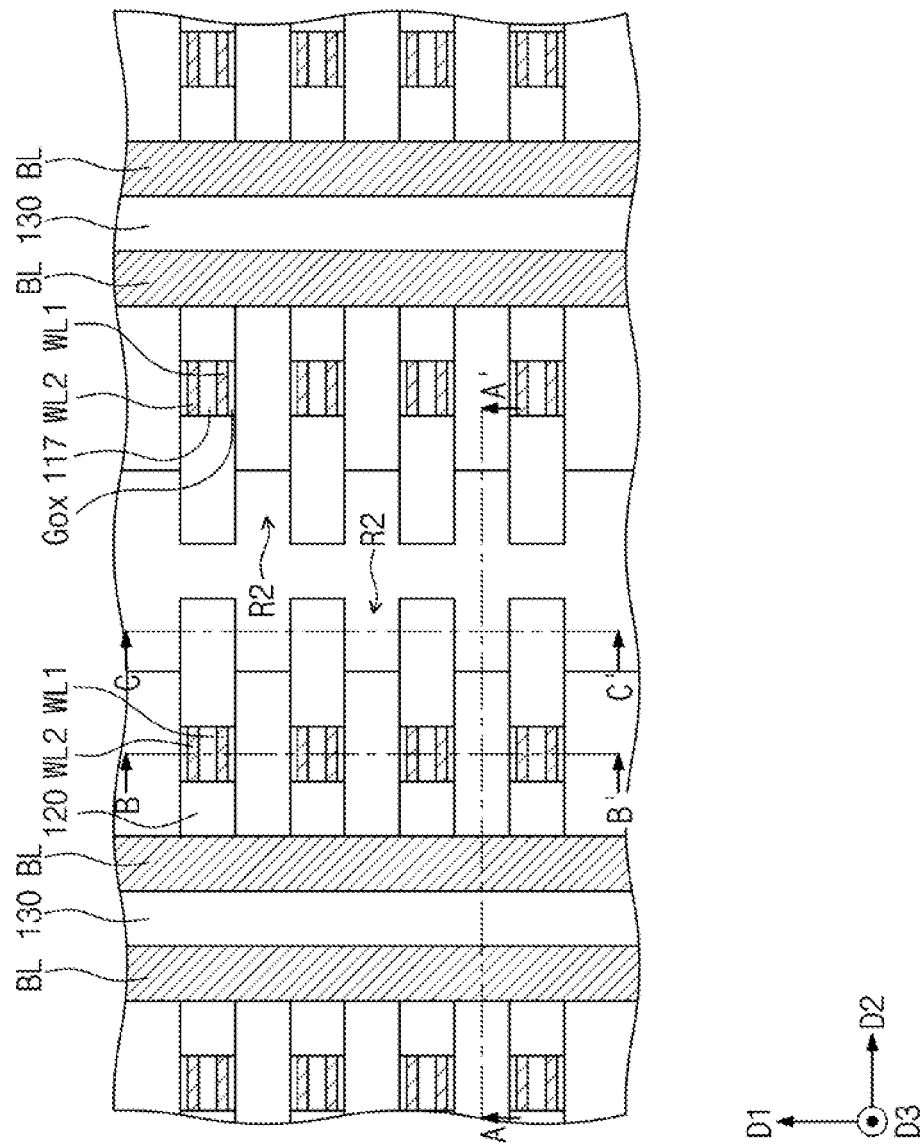
Figure 13B:
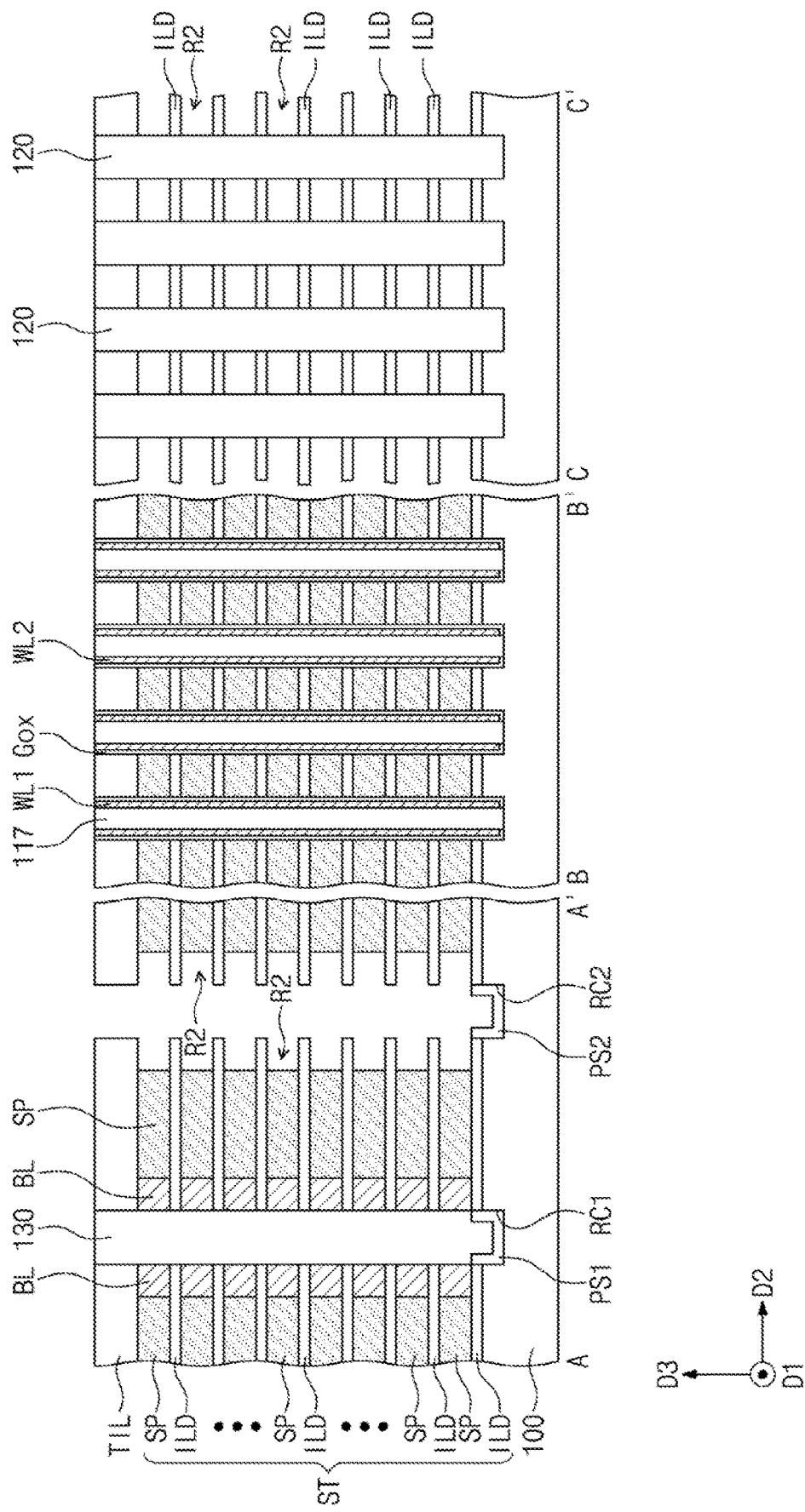

Referring to FIGS. 13A and 13B, second horizontal recess regions R2 may be formed between the interlayer insulating layers ILD by selectively removing portions of the semiconductor layers 20 exposed by the third opening OP3.

The formation of the second horizontal recess regions R2 may include isotropically etching the portions of the semiconductor layers 20 by performing an etching process having an etch selectivity with respect to the second filling insulation patterns 120, the interlayer insulating layers ILD and the second protective structure PS2.

Each of the second horizontal recess regions R2 may be formed between the interlayer insulating layers ILD adjacent to each other in the third direction D3 and between the second filling insulation patterns 120 adjacent to each other in the first direction D1. Since the second horizontal recess regions R2 are formed, semiconductor patterns SP stacked in the third direction D3 may be formed on the semiconductor substrate 100. Thus, a stack structure ST in which the interlayer insulating layers ILD and the semiconductor patterns SP are alternately stacked may be formed on the semiconductor substrate 100.

The semiconductor substrate 100 may be protected by the second protective structure PS2 during the formation of the second horizontal recess regions R2. This is so, because the second protective structure PS2 covers the top of the semiconductor substrate 100 in the second recess region RCS. Thus, it is possible to prevent a sigma-shaped undercut region from being formed under the stack structure ST by etching of a portion of the semiconductor substrate 100 during the process of isotropically etching the semiconductor layers 20.

Next, portions of the semiconductor patterns SP exposed by the second horizontal recess regions R2 may be doped with dopants. Thus, second source/drain regions SD2 may be formed in the semiconductor patterns SP, respectively.

Figure 14A:
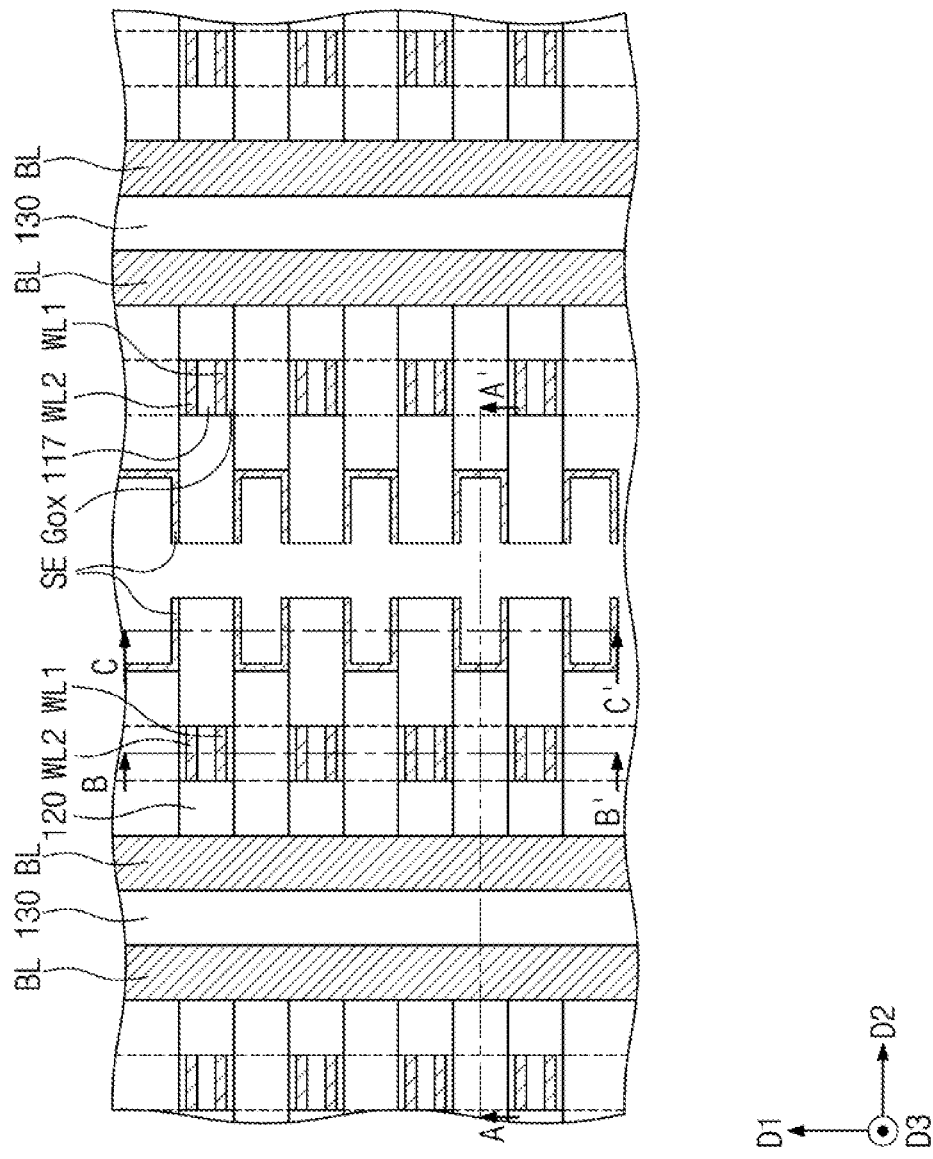
Figure 14B:
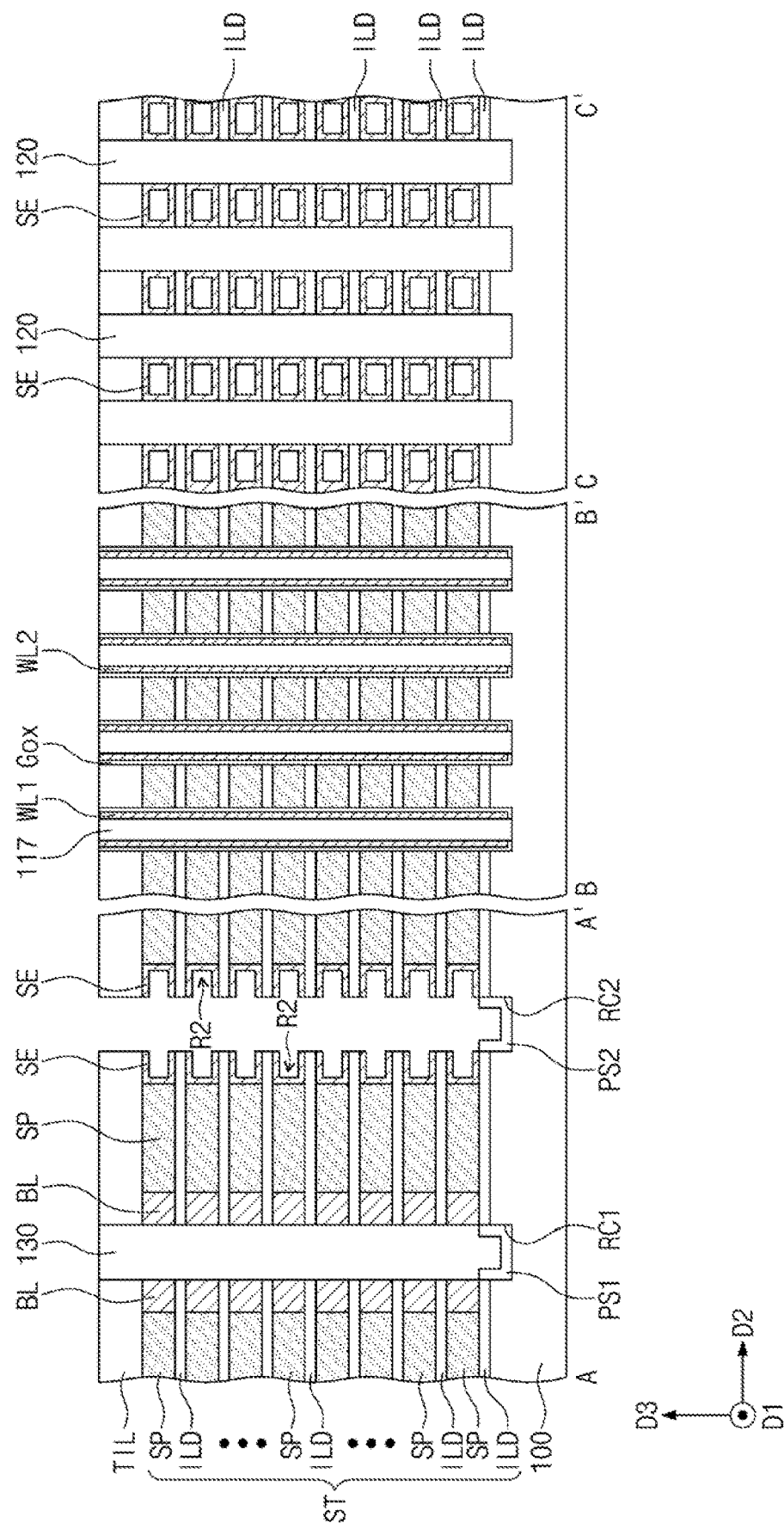

Referring to FIGS. 14A and 14B, storage electrodes SE may be locally formed in the second horizontal recess regions R2, respectively.

The formation of the storage electrodes SE may include depositing a conductive layer conformally covering inner surfaces of the second horizontal recess regions R2 and an inner surface of the third opening OP3, and removing a portion of the conductive layer deposited on the inner surface of the third opening OP3 to leave conductive patterns in the second horizontal recess regions R2, respectively.

The storage electrodes SE may be spaced apart from each other in the first direction D1, the second direction D2 and the third direction D3. The storage electrodes SE may be in contact with sidewalls of the semiconductor patterns SP exposed by the second horizontal recess regions R2. Each of the storage electrodes SE may define an empty space in each of the second horizontal recess regions R2. In other words, each of the storage electrodes SE may have a hollow cylinder-like shape with a long axis in the second direction D2. Alternatively, each of the storage electrodes SE may have a pillar-like shape with a long axis in the second direction D2. The storage electrodes SE may include at least one of a metal material, a metal nitride, or a metal silicide.

Next, referring to FIGS. 3 and 4, a dielectric layer CIL may be formed to conformally cover the inner surfaces of the second horizontal recess regions R2 in which the storage electrodes SE are formed, and a plate electrode PE may be formed to fill the second horizontal recess regions R2 having the storage electrodes SE and the dielectric layer CIL and the third opening OP3.

FIGS. 15 to 30 are views illustrating a method of forming a protective structure of a 3D semiconductor memory device, according to embodiments of the inventive concept.

Figure 15:
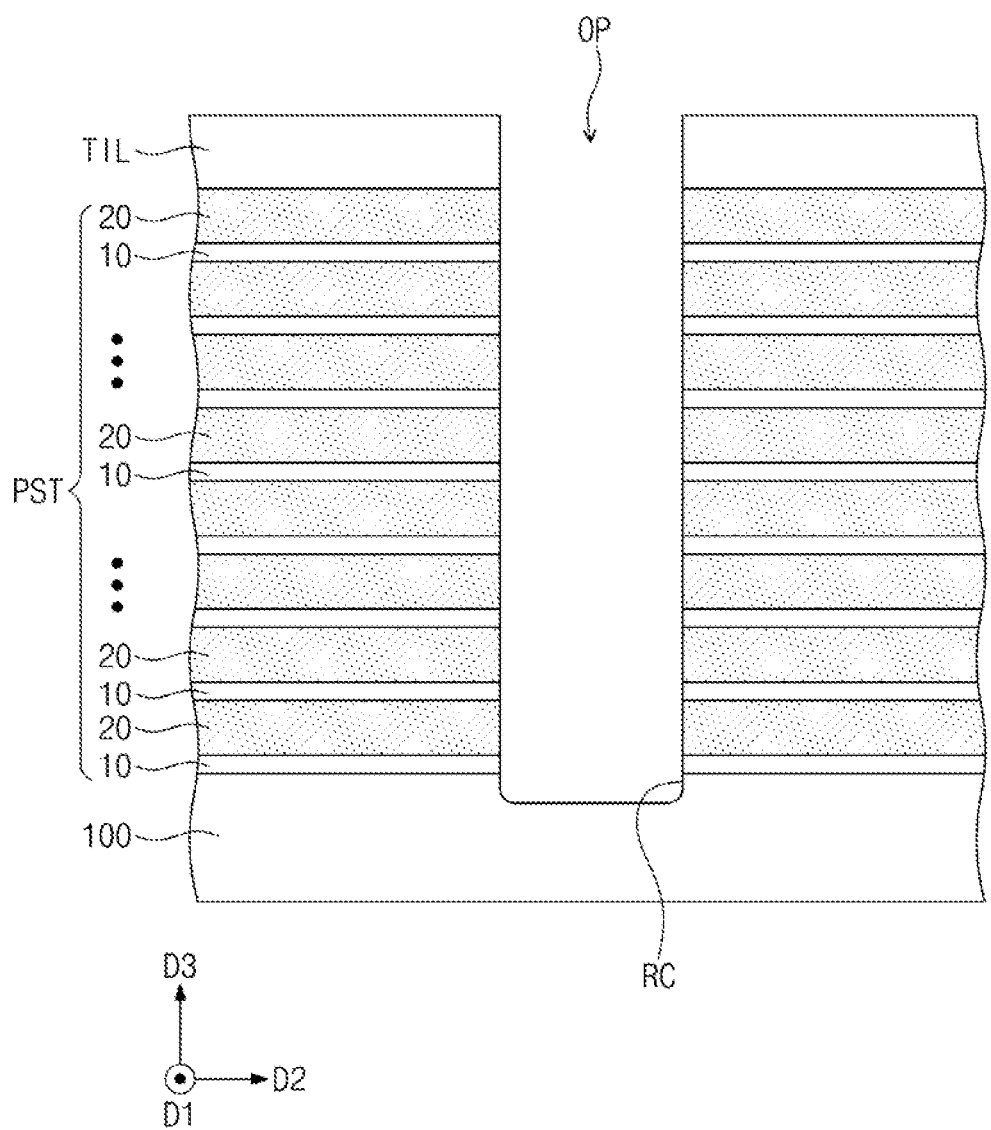
FIGS. 15, 16, 17, 18, 19, 20, 21, 22, 23, 24, 25, 26, 27, 28, 29 and 30 are views illustrating a method of forming a protective structure of a 3D semiconductor memory device, according to embodiments of the inventive concept.

Referring to FIG. 15, a preliminary stack structure PST in which sacrificial layers 10 and semiconductor layers 20 are alternately and repeatedly stacked may be formed on a semiconductor substrate 100, as described with reference to FIGS. 6A and 6B. An upper insulating layer TIL may be formed on an uppermost semiconductor layer 20 of the preliminary stack structure PST.

Next, an opening OP may be formed to penetrate the preliminary stack structure PST. The opening OP may expose the semiconductor substrate 100. Here, the opening OP may correspond to the second opening OP2 described with reference to FIGS. 9A and 9B or the third opening OP3 described with reference to FIGS. 12A and 12B.

The formation of the opening OP may include forming a mask pattern on the preliminary stack structure PST and anisotropically etching the preliminary stack structure PST using the mask pattern as an etch mask, as described above. The top surface of the semiconductor substrate 100 may be recessed by over-etch in the anisotropic etching process for forming the opening OP, thereby forming a recess region RC. In other words, a bottom surface of the recess region RC may be located at a lower level than a bottom surface of a lowermost sacrificial layer 10. Here, the recess region RC may correspond to the first recess region RC1 described with reference to FIG. 9B or the second recess region RC2 described with reference to FIG. 12B.

Figure 16:
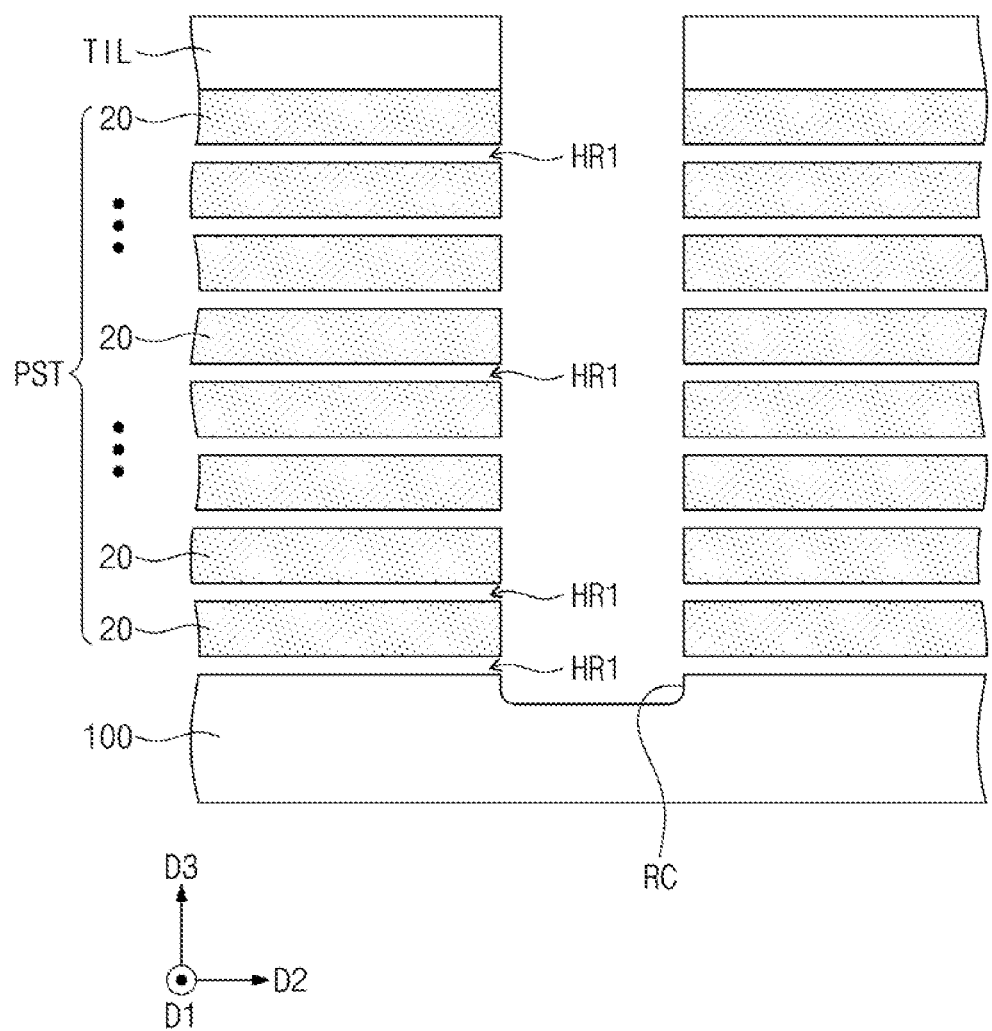

Referring to FIG. 16, the sacrificial layers 10 exposed by the opening OP may be removed to form preliminary insulating regions HR1, each of which is provided between the semiconductor layers 20 vertically adjacent to each other. The preliminary insulating regions HR1 may extend lengthwise in the second direction D2.

The formation of the preliminary insulating regions HR1 may include performing an etching process having an etch selectivity with respect to the semiconductor substrate 100, the semiconductor layers 20 and the upper insulating layer TIL. When the sacrificial layers 10 are removed, the semiconductor layers 20 may be supported by the second filling insulation patterns 120 and the first and second word lines WL1 and WL2 while being vertically spaced apart from each other and thus may not collapse.

A vertical thickness of the preliminary insulating region HR1, e.g., a vertical distance between the semiconductor layers 20 adjacent to each other may be substantially equal to a thickness of the sacrificial layer 10 that has been removed.

Figure 17:
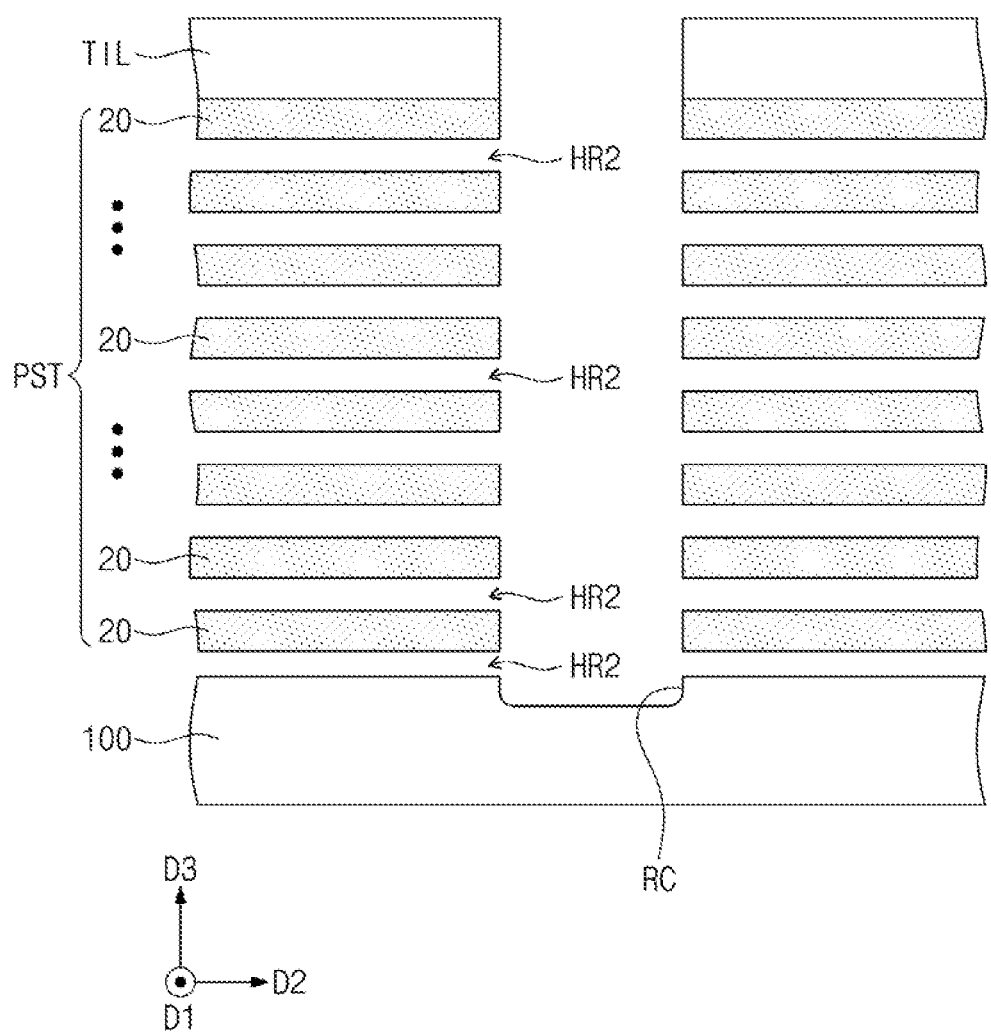

Referring to FIG. 17, an enlargement process of increasing the vertical thicknesses of the preliminary insulating regions HR1 may be performed. For example, the enlargement process may include isotropically etching the semiconductor layers 20 exposed by the preliminary insulating regions HR1. In other words, a thickness of each of the semiconductor layers 20 may be reduced by the enlargement process. Thus, each of insulating regions HR2 may be formed between the semiconductor layers 20 vertically adjacent to each other. Each of the insulating regions HR2 may be thicker than the preliminary insulating regions HR1.

The semiconductor substrate 100 exposed by the opening OP may also be etched in the isotropic etching process of the semiconductor layers 20. Thus, a depth of the recess region RC formed in the semiconductor substrate 100 may be increased.

Figure 18:
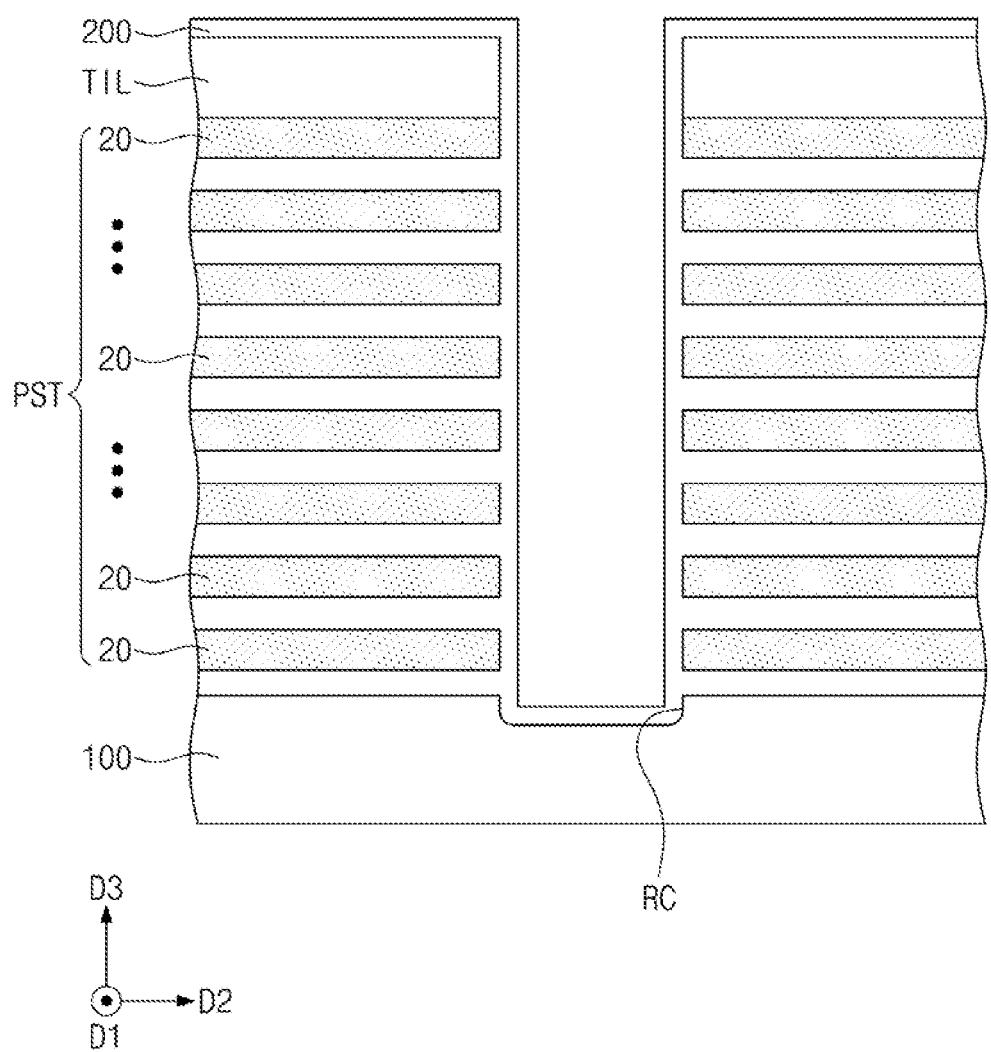

Referring to FIG. 18, an insulating layer 200 may be deposited to fill the insulating regions HR2. The insulating layer 200 may fill at least a portion of the opening OP. The insulating layer 200 may include a silicon oxide layer, a silicon nitride layer, or a silicon oxynitride layer. In some embodiments of the inventive concept, the insulating layer 200 may include the same insulating material as the upper insulating layer TIL.

Figure 19:
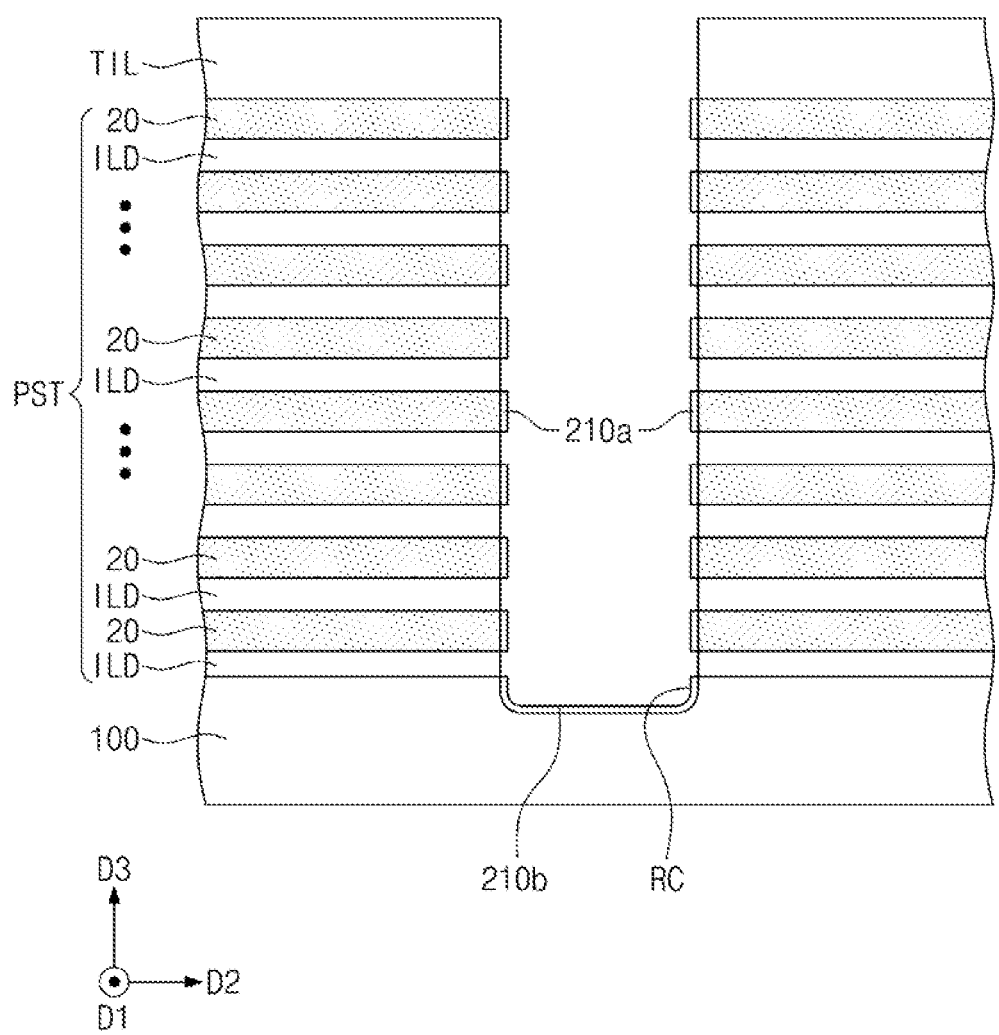

Referring to FIG. 19, the insulating layer 200 formed in the opening OP may be removed to locally form interlayer insulating layers ILD in the insulating regions HR2, respectively. The formation of the interlayer insulating layers ILD may include performing an isotropic etching process on the insulating layer 200 to expose sidewalls of the semiconductor layers 20. Thus, the insulating layer 200 on the sidewalls of the semiconductor layers 20 may be removed, and the interlayer insulating layers ILD separated from each other in the third direction D3 may be formed.

Sidewall oxide layers 210a covering the sidewalls of the semiconductor layers 20 and a protective oxide layer 210b covering a surface (e.g., an inner surface) of the recess region RC may be formed after the formation of the interlayer insulating layers ILD. The sidewall oxide layers 210a and the protective oxide layer 210b may be formed by performing an oxidation process on the semiconductor layers 20 and the semiconductor substrate 100 which are exposed by the opening OP. In other words, the sidewall oxide layers 210a and the protective oxide layer 210b may be formed of silicon oxide. Due to the oxidation process, the sidewall oxide layers 210a may be selectively formed on the sidewalls of the semiconductor layers 20 and may expose sidewalls of the interlayer insulating layers ILD.

Figure 20:
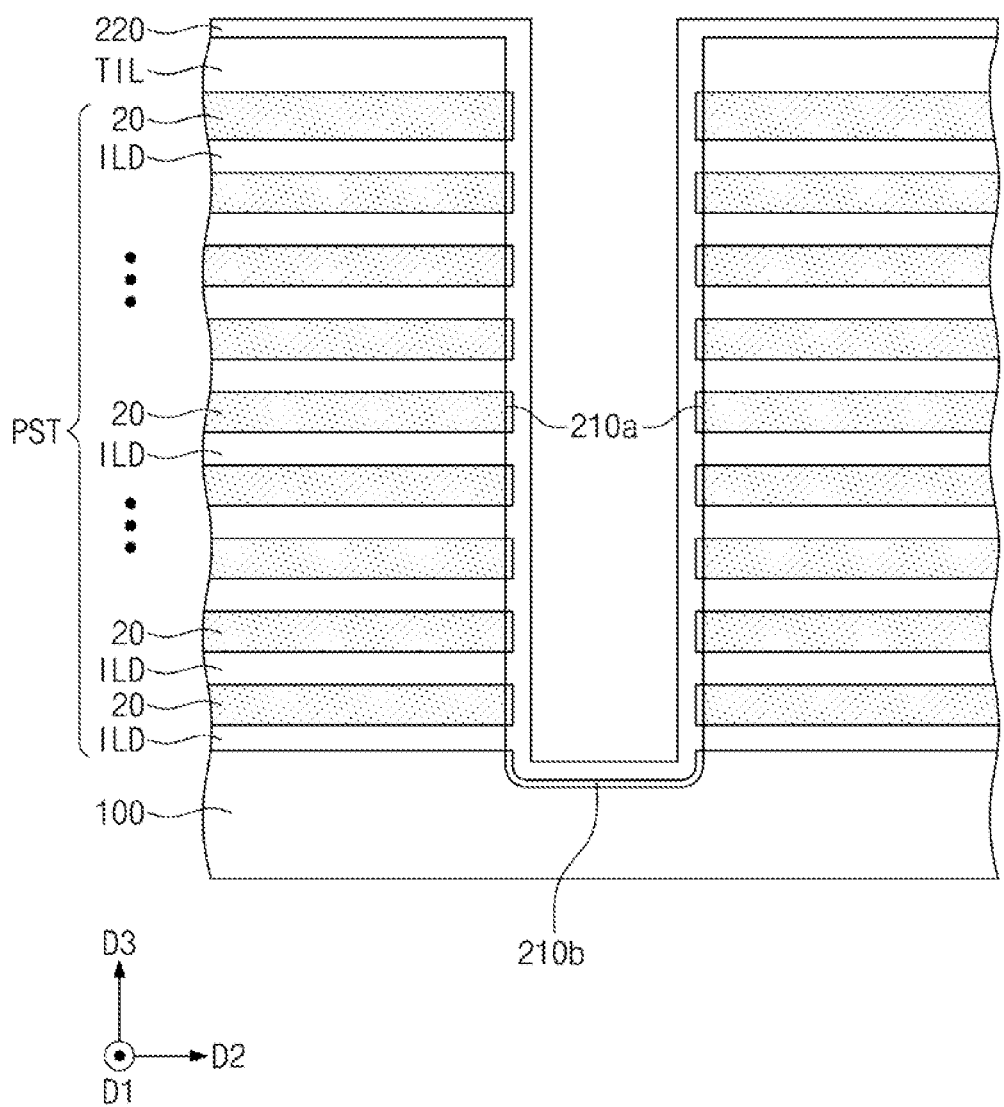

Referring to FIG. 20, a first protective layer 220 may be conformally deposited on an inner surface of the opening OP in which the sidewall oxide layers 210a and the protective oxide layer 210b are formed. In other words, the first protective layer 200 may cover opposite sidewalls of the opening OP and the bottom of the opening OP. The first protective layer 220 may be formed of an insulating material having an etch selectivity with respect to the sidewall oxide layers 210a and the protective oxide layer 210b.

Figure 21:
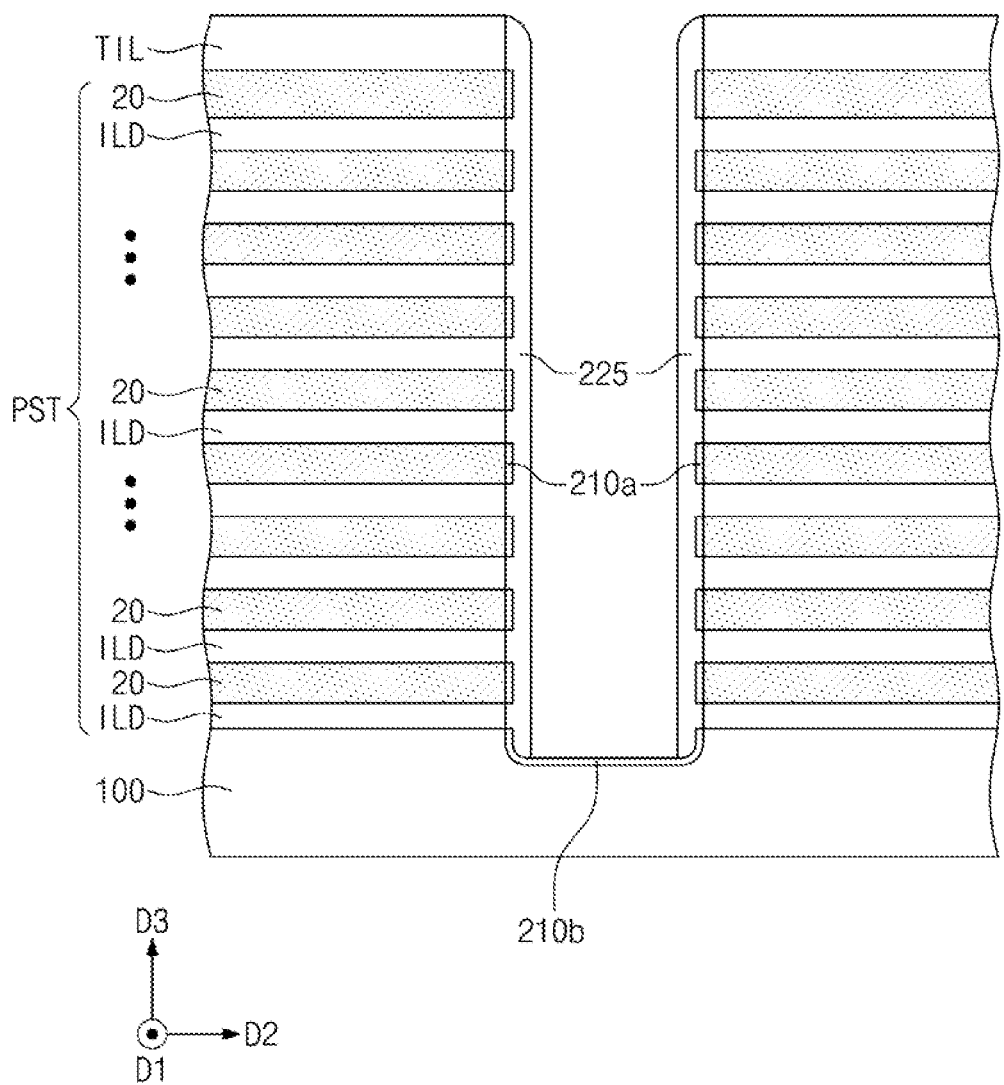

Referring to FIG. 21, a protective spacer 225 may be formed by anisotropically etching the first protective layer 220. The protective spacer 225 may expose the protective oxide layer 210b formed on a bottom surface of the recess region RC. The protective spacer 225 may cover the sidewalls of the interlayer insulating layers ILD and the sidewall oxide layers 210a formed on the sidewalls of the semiconductor layers 20.

Figure 22:
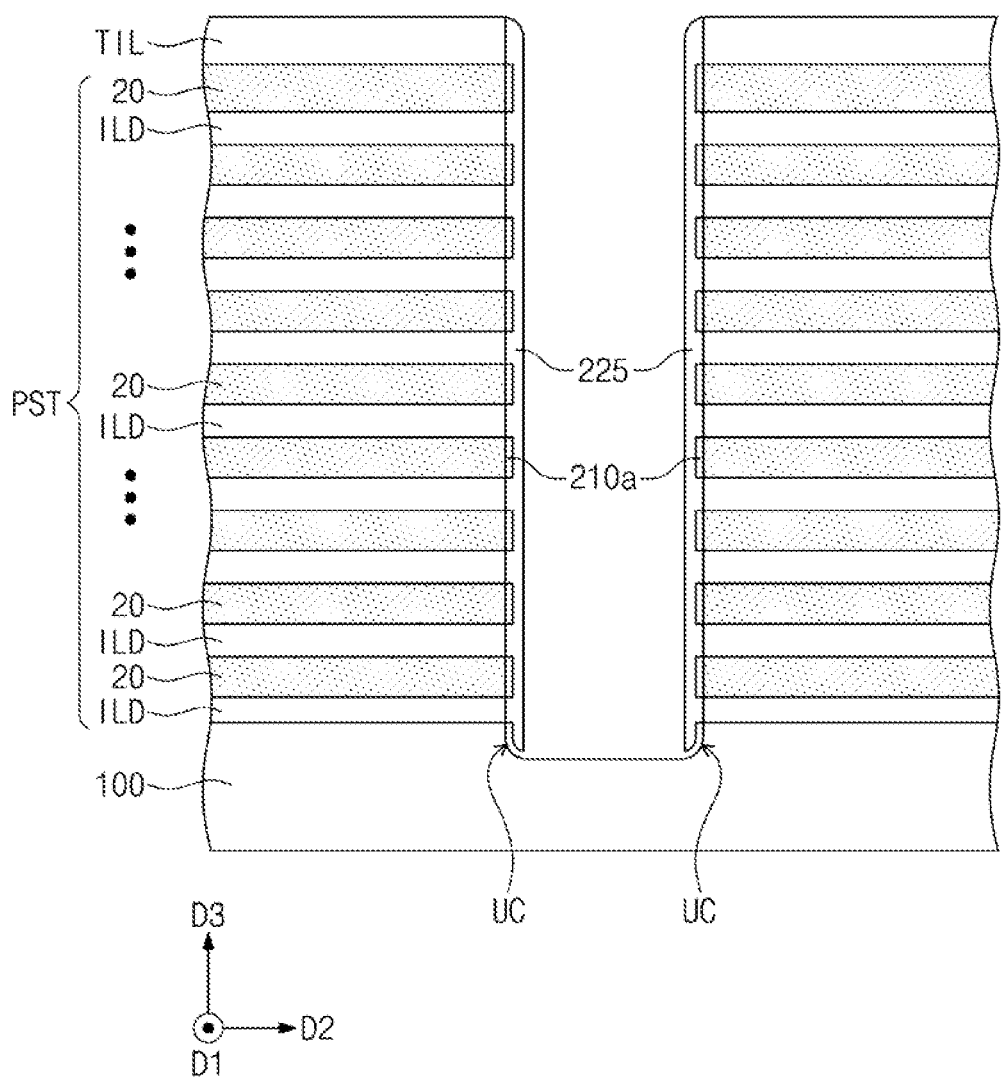

Referring to FIG. 22, the protective oxide layer 210b exposed by the protective spacer 225 may be removed to expose the semiconductor substrate 100. An undercut region UC may be formed between the protective spacer 225 and a sidewall of the recess region RC by the removal of the protective oxide layer 210b. For example, the undercut region RC may be formed on both sides of the recess region RC.

The removal of the protective oxide layer 210b may include performing an isotropic etching process having an etch selectivity with respect to the protective spacer 225.

By the formation of the undercut region UC, a lower portion of the protective spacer 225 may be spaced apart from the sidewall and the bottom surface of the recess region RC. In other words, the lower portion of the protective spacer 225 may have a shape protruding downward from the sidewall of a lowermost interlayer insulating layer ILD. The undercut region UC may correspond to a gap between the lower portion of the protective spacer 225 and a side of the recess region RC.

Figure 23:
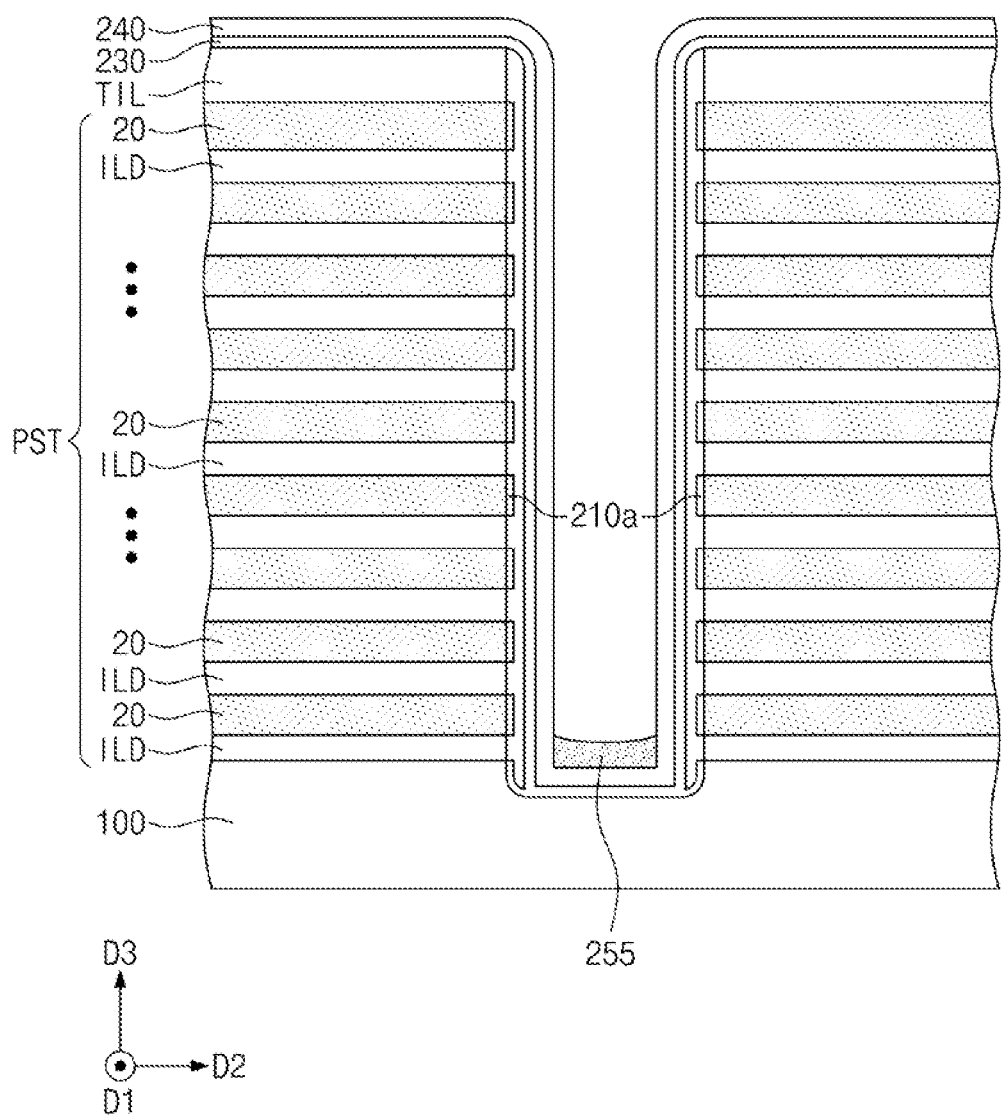

Referring to FIG. 23, a second protective layer 230 may be formed to fill the undercut region UC and to conformally cover the protective spacer 225. The second protective layer 230 may include the same insulating material as the protective spacer 225. The second protective layer 230 may be formed using an ALD method or a CVD method.

The undercut region UC may be partially or completely filled with the second protective layer 230. In other words, the second protective layer 230 may cover the surface of the recess region RC and may surround the lower portion of the protective spacer 225.

Subsequently, a buffer layer 240 may be conformally deposited on the second protective layer 230. The buffer layer 240 may partially fill the opening OP and may cover a top surface of the stack structure ST. The buffer layer 240 may include a material having an etch selectivity with respect to the protective spacer 225 and the second protective layer 230.

Subsequently, a sacrificial layer filling the opening OP having the buffer layer 240 may be formed using a spin on glass (SOG) technique. For example, the sacrificial layer may include fluoride silicate glass (FSG), SOG, or Tonen silazene (TOSZ). After filling the opening OP with the sacrificial layer, an annealing process may be performed on the sacrificial layer.

Next, a portion of the sacrificial layer may be isotropically etched to form a sacrificial pattern 255 filling a lower portion of the opening OP. The sacrificial pattern 255 may be a portion of the sacrificial layer, which remains after isotropically etching the sacrificial layer. A top surface of the sacrificial pattern 255 may be located at a level between a top surface and a bottom surface of the lowermost interlayer insulating layer ILD.

Figure 24:
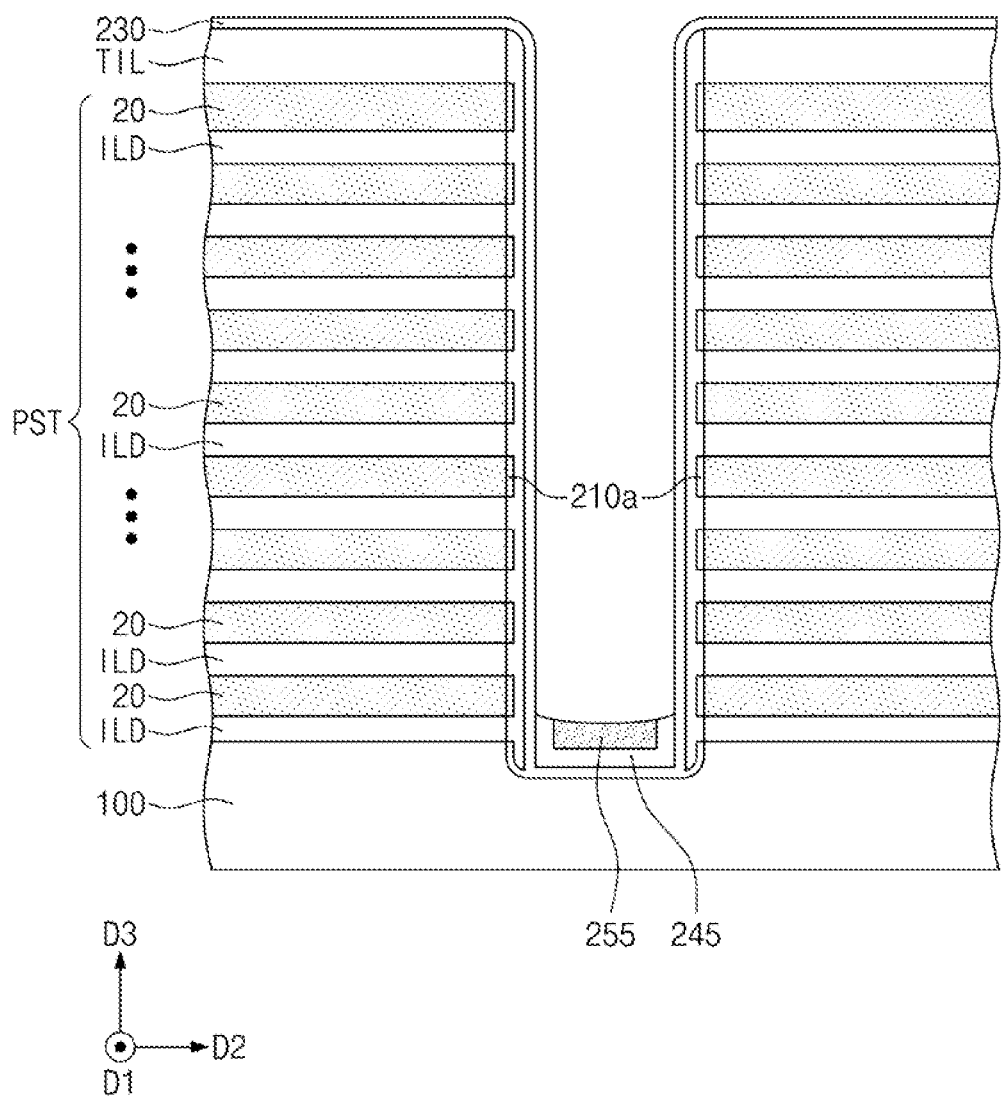

Referring to FIG. 24, the buffer layer 240 exposed by the sacrificial pattern 255 may be isotropically etched to form a buffer pattern 245. The buffer pattern 245 may be formed in a lower portion of the opening OP and may cover a bottom surface and a sidewall of the sacrificial pattern 255. In the isotropic etching process of the buffer layer 240, a top surface of the buffer pattern 245 may be controlled to be located at a level between the top surface and the bottom surface of the lowermost interlayer insulating layer ILD. However, the top surface of the buffer pattern 245 may be located slightly above the top surface of the lowermost interlayer insulating layer ILD or slightly below the bottom surface of the lowermost interlayer insulating layer ILD.

Figure 25:
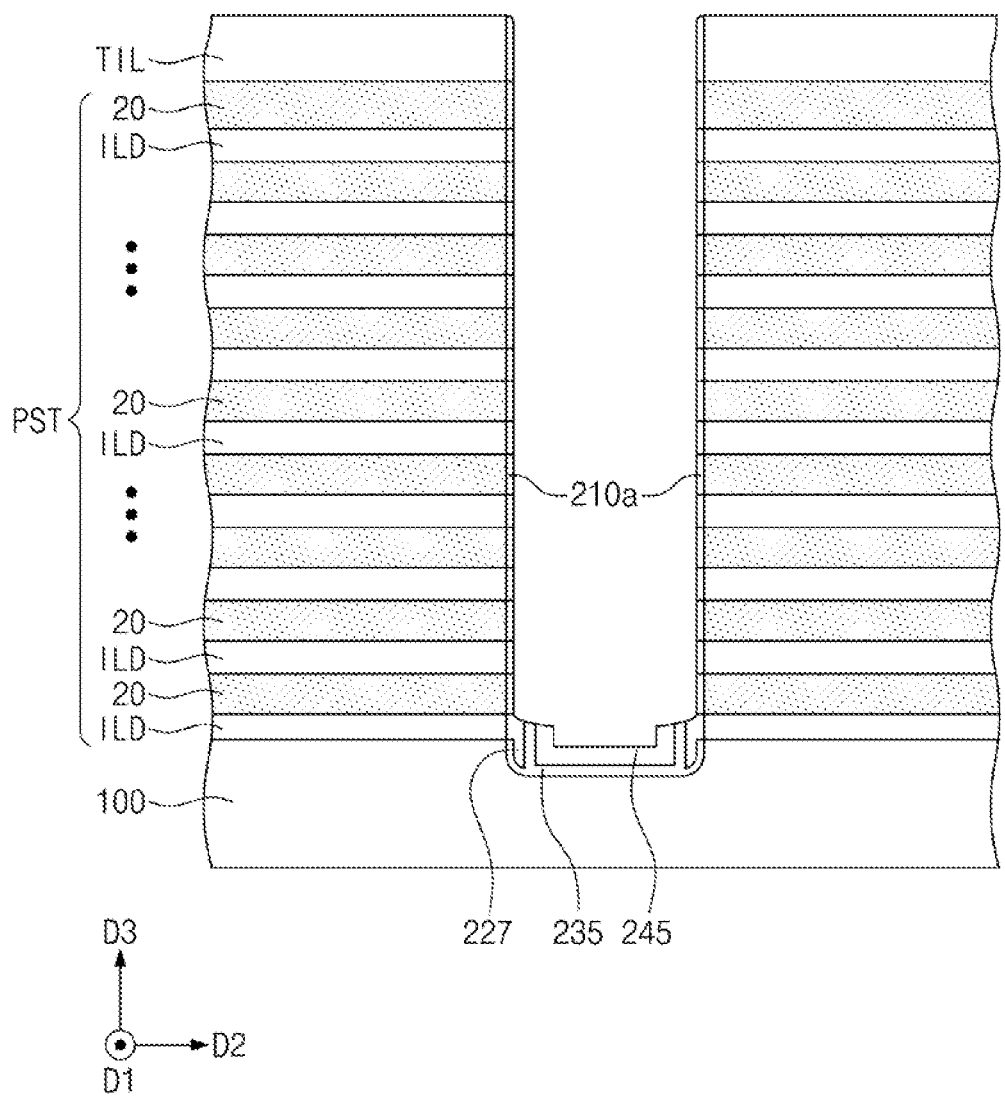

Referring to FIG. 25, an isotropic etching process may be performed on the second protective layer 230 and the protective spacer 225, which are exposed by the sacrificial pattern 255 and the buffer pattern 245. Thus, the sidewall oxide layers 210*a* may be exposed again by the opening OP.

After the isotropic etching process is performed on the second protective layer 230 and the protective spacer 225, a lower portion of the protective spacer 225 may remain to be formed into a first protective pattern 227, and a lower portion of the second protective layer 230 may remain to be formed into a second protective pattern 235. The first protective pattern 227 may cover the sidewall of the lowermost interlayer insulating layer ILD, and the second protective pattern 235 may cover the bottom surface of the recess region RC and a sidewall of the first protective pattern 227.

The first and second protective patterns 227 and 235 formed as described above may constitute a protective structure PS. The protective structure PS may correspond to the first protective structure PS1 described above or the second protective structure PS2 described above. For example, the protective structure PS may correspond to the first protective structure PS1 shown in FIGS. 5A to 5C or the second protective structure PS2 shown in FIGS. 5A to 5C.

Figure 26:
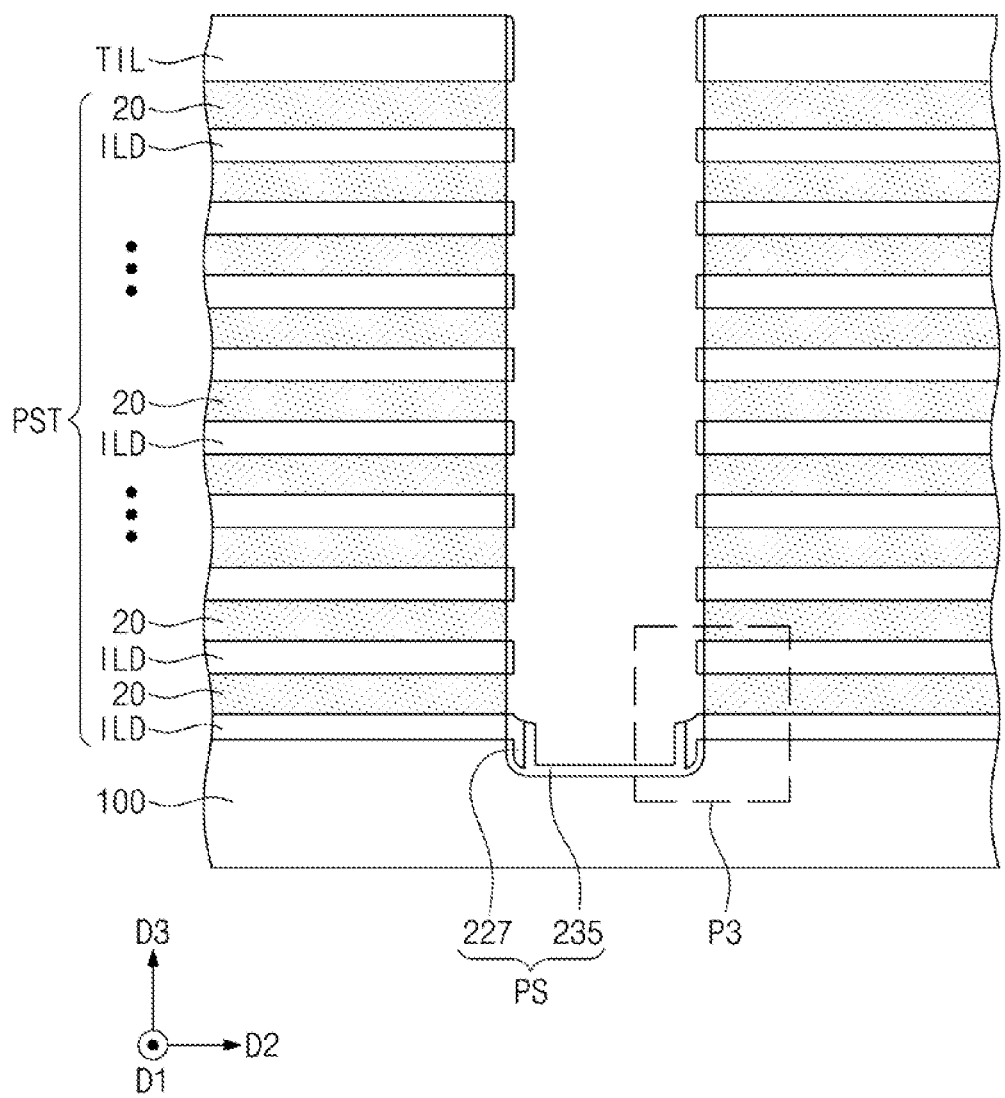
Figure 27:
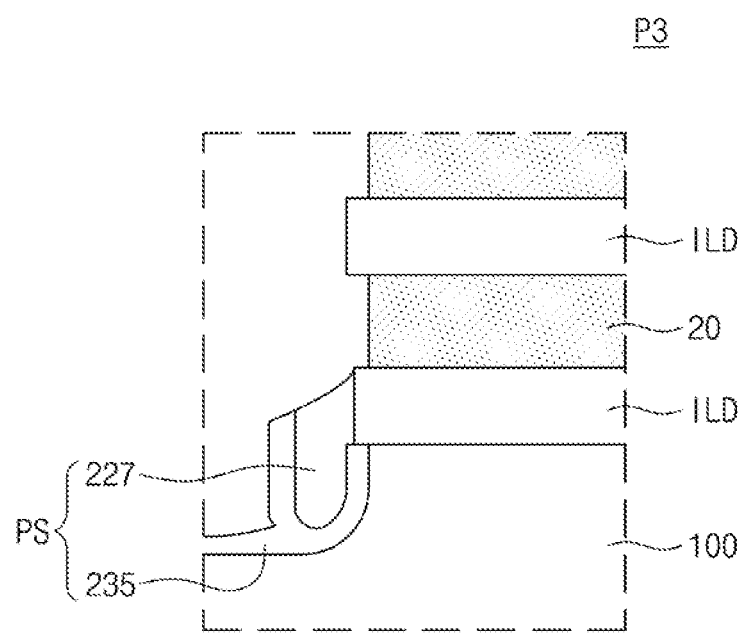

Referring to FIGS. 26 and 27 (FIG. 27 is an enlarged view of P3 in FIG. 26), the sidewall oxide layers 210*a* and the buffer pattern 245 may be removed to expose the sidewalls of the semiconductor layers 20 and a surface of the second protective pattern 235. The sidewall oxide layers 210*a* and the buffer pattern 245 may be etched by performing an isotropic etching process having an etch selectivity with respect to the interlayer insulating layers ILD and the second protective pattern 235.

The first and second protective patterns 227 and 235 may have rounded top surfaces by the isotropic etching process. For example, the first and second protective patterns 227 and 235 may have rounded or slanted top surfaces by the isotropic etching process. The second protective pattern 235 may be formed to surround a lower portion of the first protective pattern 227. For example, the lower portion of the first protective pattern 227 may be disposed in an opening of the second protective pattern 235.

Particularly, the first protective pattern 227 may have an inner sidewall facing the sidewall of the recess region RC, and an outer sidewall opposite to the inner sidewall and exposed by the opening OP. The second protective pattern 235 may be in direct contact with the inner sidewall and the outer sidewall of the first protective pattern 227. In certain embodiments of the inventive concept, the second protective pattern 235 may be in direct contact with a portion of the inner sidewall of the first protective pattern 227, and an air gap or an empty space may be formed between the inner sidewall of the first protective pattern 227 and the sidewall of the recess region RC. In certain embodiments of the inventive concept, a portion of the second protective pattern 235 provided between the inner sidewall of the first protective pattern 227 and the sidewall of the recess region RC may include a seam.

Figure 28:
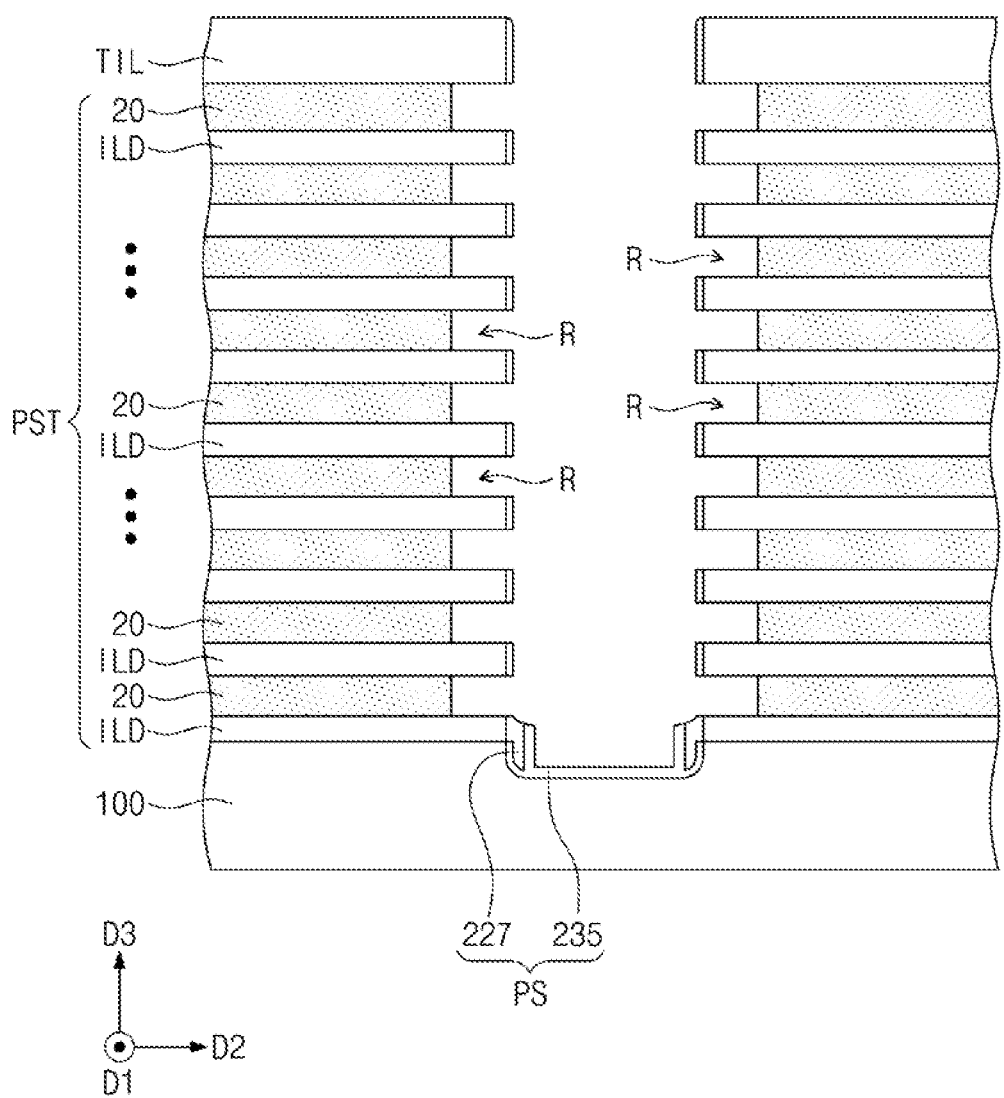

Referring to FIG. 28, portions of the semiconductor layers 20 exposed by the opening OP may be selectively removed to form horizontal recess regions R between the interlayer insulating layers ILD. Here, the horizontal recess regions R may correspond to the first horizontal recess regions R1 of FIG. 10B or the second horizontal recess regions R2 of FIG. 13B.

The formation of the horizontal recess regions R may include horizontally etching the portions of the semiconductor layers 20 by performing an isotropic etching process having an etch selectivity with respect to the interlayer insulating layers ILD and the protective structure PS.

Due to the protective structure PS, the semiconductor substrate 100 may not be exposed during the isotropic etching process of the semiconductor layers 20. In other words, it is possible to prevent the semiconductor substrate 100 from being partially etched during the isotropic etching process of the semiconductor layers 20 to cause a deformed profile under the stack structure ST.

Figure 29:
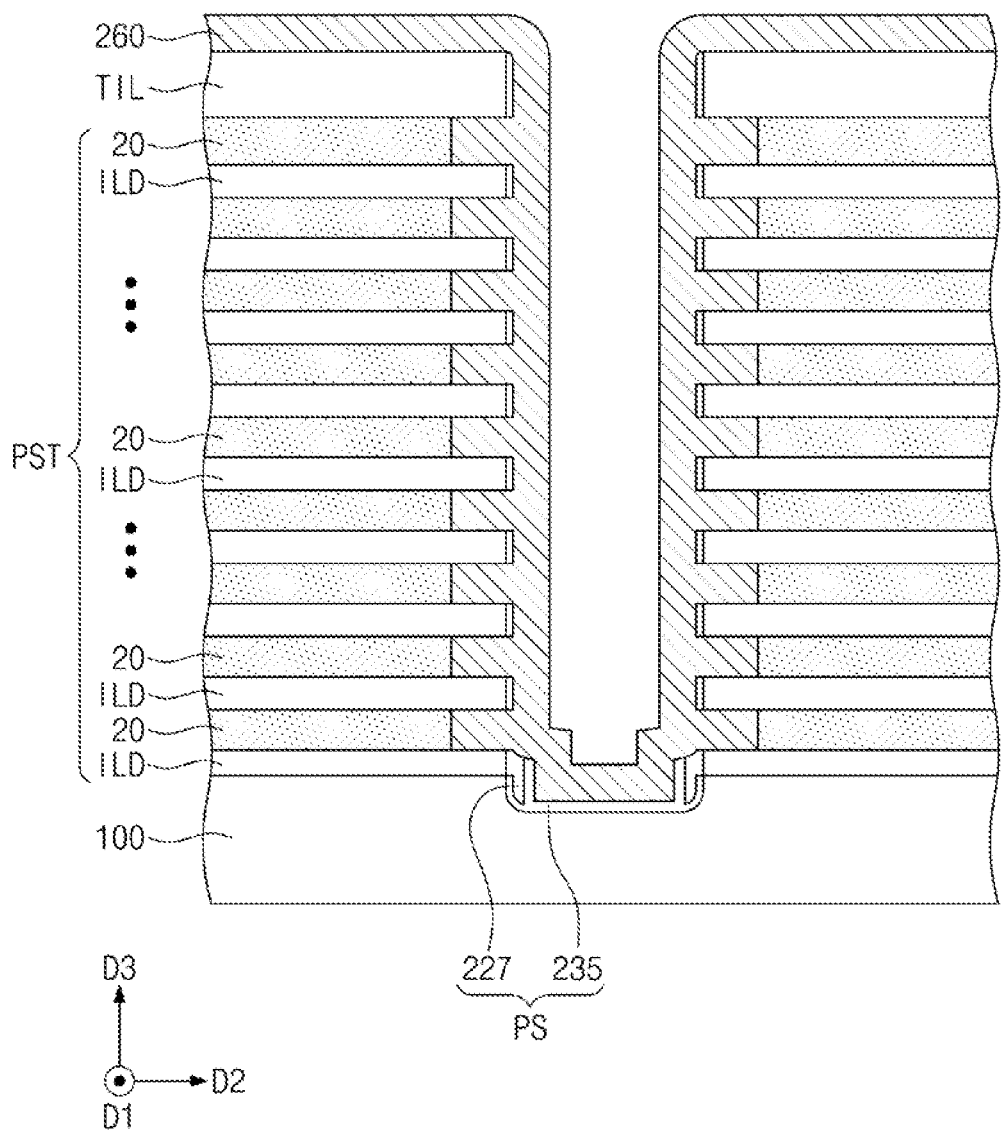

Referring to FIG. 29, a conductive layer 260 may be formed to fill the horizontal recess regions R and may conformally cover an inner surface of the opening OP. The conductive layer 260 may fill at least a portion of the opening OP.

The conductive layer 260 may include a metal layer and/or a metal silicide layer. For example, the metal layer may include at least one of a nickel layer, a cobalt layer, a platinum layer, a titanium layer, a tantalum layer, or a tungsten layer. The metal layer may be formed using an ALD process or a CVD process.

For example, the metal silicide layer may include at least one of a nickel silicide layer, a cobalt silicide layer, a platinum silicide layer, a titanium silicide layer, a tantalum silicide layer, or a tungsten silicide layer. The metal silicide layer may be formed between the metal layer and sidewalls of the semiconductor layers 20.

Figure 30:
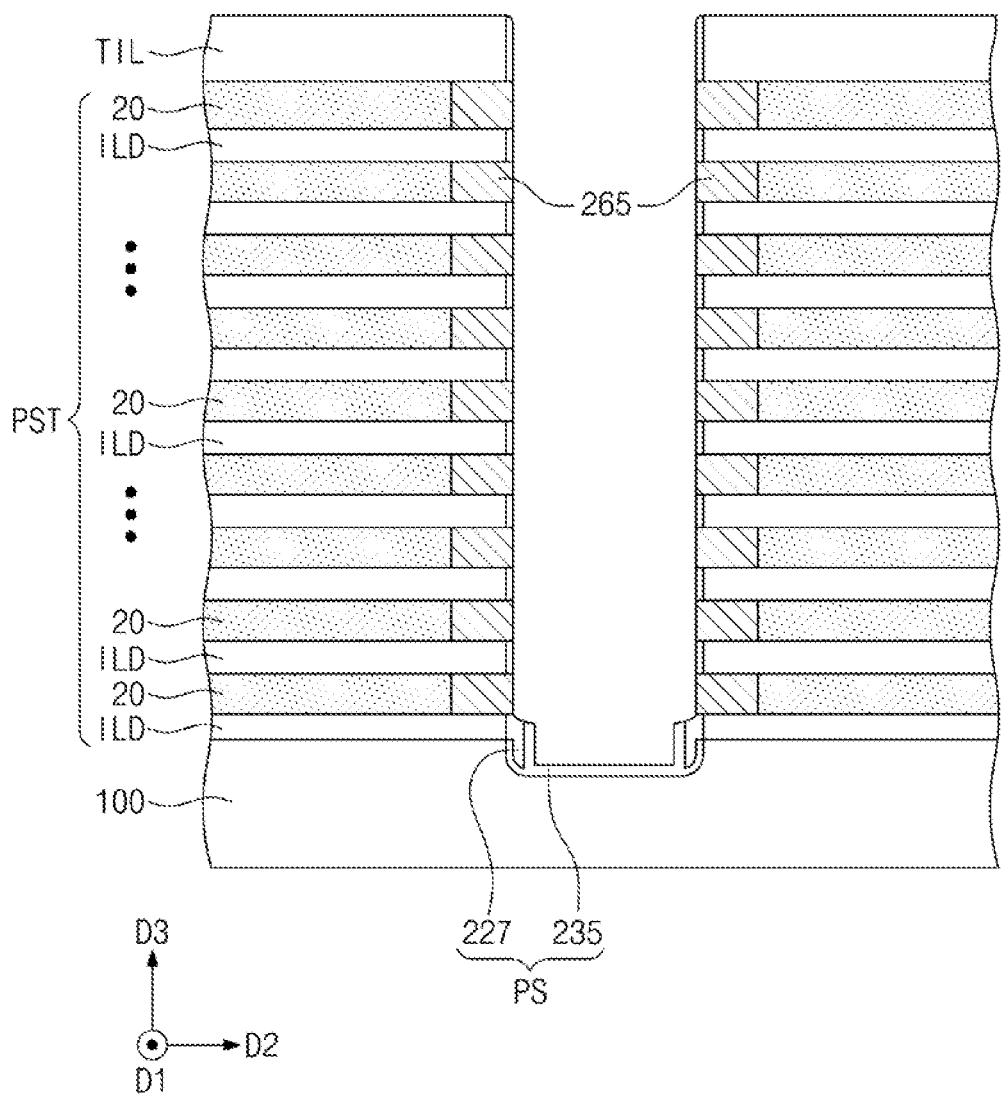

Referring to FIG. 30, conductive patterns 265 may be formed to be in contact with the semiconductor layers 20 between the interlayer insulating layers ILD.

The conductive layer 260 may be isotropically etched to expose sidewalls of the interlayer insulating layers ILD, thereby forming the conductive patterns 265. In other words, the conductive patterns 265 may be separated from each other in the third direction D3. For example, the conductive patterns 265 may be separated by the interlayer insulating layers ILD in the third direction D3. In addition, the conductive layer 260 formed on the protective structure PS may be completely removed in the isotropic etching process of the conductive layer 260. Thus, it is possible to prevent a leakage current which may be caused by a residue of the conductive layer 260 remaining on the protective structure PS and the recess region RC of the semiconductor substrate 100.

According to the embodiments of the inventive concept, the protective structure may be formed on the surface of the recess region formed in the semiconductor substrate, and thus it is possible to prevent the semiconductor substrate from being exposed in the process of horizontally etching portions of the semiconductor layers. Therefore, it is possible to prevent the semiconductor substrate from being partially etched in the isotropic etching process of the semiconductor layers to cause a deformed profile under the stack structure. As a result, it is possible to prevent a residue of the conductive layer formed in a subsequent process from remaining in the recess region of the semiconductor substrate to cause a leakage current. Embodiments of the inventive concept thus provide a 3D semiconductor memory device capable of increasing reliability and integration density and a method of manufacturing the same.

While the inventive concept has been described with reference to embodiments thereof, it will be apparent to those skilled in the art that various changes and modifications may be made thereto without departing from the spirit and scope of the inventive concept.

What is claimed is:

1. A three-dimensional (3D) semiconductor memory device, comprising:
   stack structures spaced apart from each other on a semiconductor substrate, wherein each of the stack structures comprises interlayer insulating layers and semiconductor patterns alternately stacked on the semiconductor substrate;
   conductive patterns provided between the interlayer insulating layers vertically adjacent to each other and connected to the semiconductor patterns; and
   a protective structure covering a top surface of the semiconductor substrate between the stack structures,
   wherein a top surface of the protective structure is located between a top surface and a bottom surface of a lowermost interlayer insulating layer of the interlayer insulating layers,
   wherein the protective structure covers a sidewall of the lowermost interlayer insulating layer.

2. The 3D semiconductor memory device of claim 1, wherein the semiconductor substrate includes a recess region between the stack structures,
   wherein the protective structure includes: a horizontal portion covering a bottom surface of the recess region; and a sidewall portion covering a sidewall of the recess region and a sidewall of the lowermost interlayer insulating layer, and
   wherein a thickness of the sidewall portion is greater than a thickness of the horizontal portion.

3. The 3D semiconductor memory device of claim 2, wherein the sidewall portion of the protective structure has a rounded top surface.

4. The 3D semiconductor memory device of claim 1, wherein the semiconductor substrate includes a recess region between the stack structures,
   wherein the protective structure comprises:
   a first protective pattern spaced apart from a sidewall of the recess region and covering a sidewall of the lowermost interlayer insulating layer; and
   a second protective pattern disposed between the first protective pattern and the sidewall of the recess region and covering a bottom surface of the recess region.

5. The 3D semiconductor memory device of claim 4, wherein the lowermost interlayer insulating layer is in contact with a top surface of the semiconductor substrate.

6. The 3D semiconductor memory device of claim 1, wherein the semiconductor patterns include the same semiconductor material as the semiconductor substrate.

7. The 3D semiconductor memory device of claim 1, wherein the protective structure includes the same insulating material as the interlayer insulating layers.

8. The 3D semiconductor memory device of claim 1, wherein each of the interlayer insulating layers has a first thickness, and each of the semiconductor patterns has a second thickness greater than the first thickness.

9. The 3D semiconductor memory device of claim 1, wherein the conductive patterns extend in a first direction parallel to a top surface of the semiconductor substrate.

10. The 3D semiconductor memory device of claim 1, further comprising:
    a dielectric layer covering the conductive patterns; and a plate electrode on the dielectric layer.

11. A three-dimensional (3D) semiconductor memory device, comprising:
    a semiconductor substrate including first and second recess regions which extend in a first direction and are spaced apart from each other in a second direction different from the first direction;
    a stack structure disposed between the first and second recess regions in a plan view and comprising interlayer insulating layers and semiconductor patterns which are alternately stacked on the semiconductor substrate;
    a first conductive pattern extending in a third direction perpendicular to a top surface of the semiconductor substrate and intersecting the stack structure;
    second conductive patterns provided between the interlayer insulating layers vertically adjacent to each other, the second conductive patterns crossing first end portions of the semiconductor patterns in the first direction;
    data storage elements provided between the interlayer insulating layers vertically adjacent to each other and connected to second end portions, opposite to the first end portions, of the semiconductor patterns;
    a first protective structure disposed in the first recess region; and
    a second protective structure disposed in the second recess region,
    wherein each of the first and second protective structures covers a sidewall of a lowermost interlayer insulating layer of the interlayer insulating layers.

12. The 3D semiconductor memory device of claim 11, wherein topmost surfaces of the first and second protective structures are located between a top surface and a bottom surface of the lowermost interlayer insulating layer of the interlayer insulating layers.

13. The 3D semiconductor memory device of claim 11, wherein the first protective structure includes: a horizontal portion covering a bottom surface of the first recess region; and a sidewall portion covering a sidewall of the first recess region and a sidewall of the lowermost interlayer insulating layer of the interlayer insulating layers,
    wherein the second protective structure includes: a horizontal portion covering a bottom surface of the second recess region; and a sidewall portion covering a sidewall of the second recess region and another sidewall of the lowermost interlayer insulating layer of the interlayer insulating layers, wherein a thickness of the sidewall portion of the first protective structure is greater than a thickness of the horizontal portion of the first protective structure, and a thickness of the sidewall portion of the second protective structure is greater than a thickness of the horizontal portion of the second protective structure.

14. The 3D semiconductor memory device of claim 11, wherein each of the first and second protective structures comprises:

a first protective pattern covering a sidewall of the lowermost interlayer insulating layer of the interlayer insulating layers; and a second protective pattern covering the first protective pattern, wherein the second protective pattern of the first protective structure covers a bottom surface of the first recess region, and the second protective pattern of the second protective structure covers a bottom surface of the second recess region.

15. The 3D semiconductor memory device of claim 11, wherein the first and second protective structures include the same insulating material as the interlayer insulating layers.

16. The 3D semiconductor memory device of claim 11, wherein each of the semiconductor patterns includes: first and second source/drain regions spaced apart from each other in the second direction; and a channel region between the first and second source/drain regions, and wherein the first conductive pattern is adjacent to the channel regions of the semiconductor patterns.

17. A three-dimensional (3D) semiconductor memory device, comprising:

a semiconductor substrate including first and second recess regions which extend in a first direction and are spaced apart from each other in a second direction different from the first direction;

stack structures disposed between the first and second recess regions in a plan view and spaced apart from each other in the first direction, wherein each of the stack structures comprises interlayer insulating layers and semiconductor patterns which are alternately stacked on the semiconductor substrate;

word lines extending in a third direction perpendicular to a top surface of the semiconductor substrate and intersecting the stack structures, respectively;

bit lines provided between the interlayer insulating layers vertically adjacent to each other and in contact with first end portions of the semiconductor patterns, wherein the bit lines extend in the first direction;

storage electrodes provided between the interlayer insulating layers vertically adjacent to each other and in contact with second end portions, opposite to the first end portions, of the semiconductor patterns;

a first protective structure disposed in the first recess region;

a filling insulation pattern covering sidewalls of the bit lines and sidewalls of the interlayer insulating layers and disposed on the first protective structure;

a second protective structure disposed in the second recess region;

a plate electrode covering the storage electrodes and disposed on the second protective structure; and a dielectric layer between the plate electrode and the storage electrodes, wherein each of the first and second protective structures comprises:

a first protective pattern covering a sidewall of a lowermost interlayer insulating layer of the interlayer insulating layers; and a second protective pattern, wherein the second protective pattern of the first protective structure is disposed between the first protective pattern of the first protective structure and a sidewall of the first recess region and covers a bottom surface of the first recess region, and the second protective pattern of the second protective structure is disposed between the first protective pattern of the second protective structure and a sidewall of the second recess region and covers a bottom surface of the second recess region, wherein topmost surfaces of the first and second protective structures are located between a top surface and a bottom surface of the lowermost interlayer insulating layer.

18. The 3D semiconductor memory device of claim 17, wherein the lowermost interlayer insulating layer is in contact with the top surface of the semiconductor substrate, and wherein the first and second protective structures include the same insulating material as the interlayer insulating layers.

19. The 3D semiconductor memory device of claim 17, wherein a thickness of the first protective structure is greater on the sidewall of the first recess region than on the bottom surface of the first recess region, and wherein a thickness of the second protective structure is greater on the sidewall of the second recess region than on the bottom surface of the second recess region.

20. The 3D semiconductor memory device of claim 17, wherein each of the interlayer insulating layers has a first thickness, and each of the semiconductor patterns has a second thickness greater than the first thickness.

* * * * *